US011350523B2

(12) United States Patent
Sumi et al.

(10) Patent No.: US 11,350,523 B2
(45) Date of Patent: May 31, 2022

(54) CERAMIC WIRING BOARD AND METHOD FOR PRODUCING THE SAME

(71) Applicant: Murata Manufacturing Co., Ltd., Nagaokakyo-shi, Kyoto-fu (JP)

(72) Inventors: Takahiro Sumi, Nagaokakyo (JP); Takahiro Oka, Nagaokakyo (JP); Yoshitake Yamagami, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 696 days.

(21) Appl. No.: 15/410,116

(22) Filed: Jan. 19, 2017

(65) Prior Publication Data

US 2017/0135205 A1   May 11, 2017

Related U.S. Application Data

(63) Continuation of application No. PCT/JP2016/062132, filed on Apr. 15, 2016.

(30) Foreign Application Priority Data

Apr. 17, 2015 (JP) ................... 2015-085304

(51) Int. Cl.
*H05K 1/03* (2006.01)
*H05K 3/12* (2006.01)
(Continued)

(52) U.S. Cl.
CPC ............. *H05K 1/0306* (2013.01); *H05K 1/09* (2013.01); *H05K 1/115* (2013.01); *H05K 3/0044* (2013.01);
(Continued)

(58) Field of Classification Search
CPC ........ H05K 1/0306; H05K 1/09; H05K 1/115; H05K 2201/09563; H05K 3/4038
(Continued)

(56) References Cited

U.S. PATENT DOCUMENTS 4,536,435 A * 8/1985 Utsumi ............... C03C 10/0054
257/E23.009
5,015,314 A * 5/1991 Suzuki ..................... H01B 1/16
156/89.18
(Continued)

FOREIGN PATENT DOCUMENTS

JP    S63-271995 A    11/1988
JP    2003-054946 A   2/2003
(Continued)

OTHER PUBLICATIONS

Written Opinion of the International Searching Authority issued for PCT/JP2016/062132, dated Jun. 14, 2016.
(Continued)

*Primary Examiner* — Timothy J Thompson
*Assistant Examiner* — Rhadames Alonzo Miller
(74) *Attorney, Agent, or Firm* — ArentFox Schiff LLP

(57) ABSTRACT

A ceramic wiring board that includes a ceramic insulator and a via-conductor. The ceramic insulator includes a crystalline constituent and an amorphous constituent. The via-conductor includes a metal and an oxide. The crystalline constituent and the oxide include at least one metal element in common. A tubular region having a thickness of 5 μm adjoins and surrounds the via-conductor and has a higher concentration of the metal element than the ceramic insulator.

17 Claims, 6 Drawing Sheets

(51) Int. Cl.
  *H05K 3/40* (2006.01)
  *H05K 1/09* (2006.01)
  *H05K 1/11* (2006.01)
  *H05K 3/00* (2006.01)
  *H05K 3/22* (2006.01)
  *H05K 3/46* (2006.01)

(52) U.S. Cl.
  CPC ............. *H05K 3/1291* (2013.01); *H05K 3/22* (2013.01); *H05K 3/4038* (2013.01); *H05K 3/4061* (2013.01); *H05K 3/4647* (2013.01); *H05K 3/4629* (2013.01); *H05K 2201/0175* (2013.01); *H05K 2201/098* (2013.01); *H05K 2201/09563* (2013.01); *H05K 2201/09809* (2013.01); *H05K 2203/1126* (2013.01)

(58) Field of Classification Search
  USPC .......................................................... 174/257
  See application file for complete search history.

(56) References Cited

U.S. PATENT DOCUMENTS

| | | | | |
|---|---|---|---|---|
| 5,658,835 | A | * | 8/1997 | Onitani ............... C03C 10/0045 |
| | | | | 501/10 |
| 6,120,906 | A | * | 9/2000 | Terashi ................. C03C 14/004 |
| | | | | 257/E23.009 |
| 6,121,173 | A | * | 9/2000 | Terashi ................... C04B 35/16 |
| | | | | 501/32 |
| 2001/0025722 | A1 | * | 10/2001 | Ami .................. H01L 23/49827 |
| | | | | 174/257 |
| 2003/0051811 | A1 | * | 3/2003 | Uchimaru ............... B32B 18/00 |
| | | | | 156/345.1 |
| 2005/0186407 | A1 | * | 8/2005 | Mori ....................... B32B 18/00 |
| | | | | 428/210 |
| 2005/0223943 | A1 | * | 10/2005 | Seo ....................... C01G 23/003 |
| | | | | 106/436 |
| 2006/0287184 | A1 | * | 12/2006 | Mori ....................... C03C 3/066 |
| | | | | 501/32 |
| 2010/0294552 | A1 | * | 11/2010 | Kobayashi ........ H01L 23/49827 |
| | | | | 174/260 |
| 2011/0077141 | A1 | * | 3/2011 | Walker .................. C04B 35/111 |
| | | | | 501/32 |
| 2012/0162838 | A1 | * | 6/2012 | Sawada ..................... H01T 4/12 |
| | | | | 361/56 |

FOREIGN PATENT DOCUMENTS

| | | | | |
|---|---|---|---|---|
| JP | 2003-258433 | A | | 9/2003 |
| JP | 2005-306714 | A | | 11/2005 |
| JP | 2005306714 | A | * | 11/2005 |
| JP | 2006-083021 | A | | 3/2006 |
| JP | 2006083021 | A | * | 3/2006 ............. C03B 32/02 |
| JP | 2007-129048 | A | | 5/2007 |
| JP | 2007129048 | A | * | 5/2007 |
| JP | 2008-004514 | A | | 1/2008 |
| JP | 2008004514 | A | * | 1/2008 |

OTHER PUBLICATIONS

International Search Report issued in International Application No. PCT/JP2016/062132, dated Jun. 14, 2016.

* cited by examiner

FIG. 11 – PRIOR ART
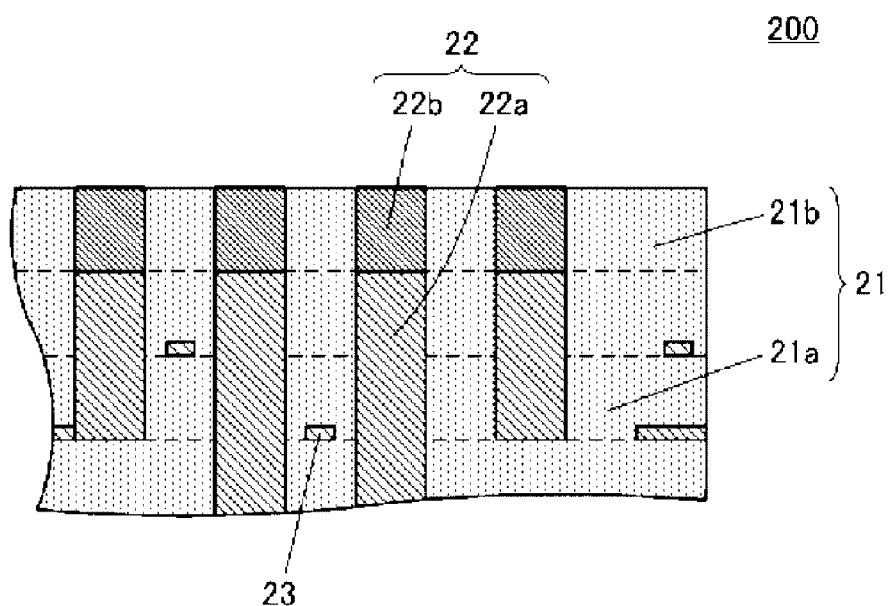

the surface of the ceramic insulator 21 have a lower content of the amorphous constituent than portions 22a of the via-conductors 22 which are formed in an insulating layer 21a located inside the ceramic insulator 21.

CERAMIC WIRING BOARD AND METHOD FOR PRODUCING THE SAME

CROSS REFERENCE TO RELATED APPLICATIONS

The present application is a continuation of International application No. PCT/JP2016/062132, filed Apr. 15, 2016, which claims priority to Japanese Patent Application No. 2015-085304, filed Apr. 17, 2015, the entire contents of each of which are incorporated herein by reference.

FIELD OF THE INVENTION

The present invention relates to a ceramic wiring board and a method for producing the ceramic wiring board and specifically to a ceramic wiring board that includes a ceramic insulator including crystalline constituents and an amorphous constituent, that is, a "glass-ceramic" insulator.

BACKGROUND OF THE INVENTION

Ceramic wiring boards include a ceramic insulator, via-conductors arranged to be orthogonal to the principal plane of the ceramic insulator, pattern conductors arranged to be parallel to the principal plane of the ceramic insulator, and mounting electrodes disposed on the principal plane of the insulator. The ceramic wiring boards have been increasingly used in a high-frequency range on the order of a gigahertz or higher with the increase in the speed of information communications. Accordingly, ceramic insulators having a low dielectric constant, such as glass-ceramic insulators, have been used in order to reduce the transmission loss.

The via-conductors and the pattern conductors are formed using a conductive paste that includes a metal powder containing Cu, which is considered to be highly resistant to electrochemical migration, an amorphous powder, and an organic vehicle. The amorphous powder reduces the difference between the shrinkage of the raw-material powder of the ceramic insulator included in the ceramic wiring boards and the shrinkage of the metal powder which occur during the sintering process and improves the bond between the ceramic insulator and the above conductors. Mounting electrodes, to which electronic components such as an IC chip are to be connected, are formed, by plating, on end portions of the via-conductors formed in the ceramic wiring board which are exposed at the principal plane of the ceramic wiring board.

When the unfired via-conductors formed using the above-described conductive paste are fired, the amorphous constituent contained in the conductive paste rises to the end portions of the via-conductors which are exposed at the principal plane of the ceramic wiring board. This results in failure to form plating films on the end portions of the via-conductors in the plating process conducted for forming the mounting electrodes.

Japanese Unexamined Patent Application Publication No. 2003-258433 (Patent Document 1) proposes an example of a ceramic wiring board that addresses the above-described issues.

FIG. 11 is a diagram schematically illustrating the ceramic wiring board 200 described in Patent Document 1. The ceramic wiring board 200 includes a ceramic insulator 21 constituted by a plurality of glass-ceramic layers stacked on top of one another and via-conductors 22 composed of Cu or a Cu alloy which are formed in the ceramic insulator 21. Portions 22b of the via-conductors 22 which are formed in It is described that the above-described ceramic wiring board 200 advantageously improves the bond between the ceramic insulator 200 and the via-conductors 22 and reduces the likelihood of the amorphous constituent rising to the end portions of the via-conductors 22.

Patent Document 1: Japanese Unexamined Patent Application Publication No. 2003-258433

SUMMARY OF INVENTION

The inventor of the present invention studied the following items in order to make the present invention.

In an unfired ceramic wiring board that includes an unfired ceramic insulator and unfired via-conductors, an amorphous constituent of the unfired ceramic insulator and an amorphous constituent of the unfired via-conductors commonly have a high affinity for each other. This causes the amorphous constituent of the unfired ceramic insulator to migrate into the unfired via-conductors in the process of firing of the unfired ceramic wiring board. Thus, even when the content of the amorphous constituent in portions of the unfired via-conductors which are located in the vicinity of the surface of the unfired ceramic wiring board is reduced, the migration of the amorphous constituent from the unfired ceramic insulator increases the content of the amorphous constituent in the above portions of the unfired via-conductors. As a result, the amorphous constituent may rise to the end portions of the via-conductors as in the related art.

In response to the demand for high-speed signal processing, attempts have been made to increase the number of the outer electrodes of IC chips and reduce the pitch at which the outer electrodes are arranged. Accordingly, an increase in the number of the mounting electrodes included in the ceramic wiring board, on which IC chips are to be mounted, and a reduction in the pitch at which the mounting electrodes are arranged are also required. For increasing the number of the mounting electrodes and reducing the pitch at which the mounting electrodes are arranged, the diameter of the via-conductors needs to be reduced.

In the case where the diameter of the via-conductors is larger than, for example, 100 μm, the exposed metal portions having a certain area required for forming the mounting electrodes thereon by plating can be maintained even when the amorphous constituent rises to the end portions of the via-conductors. However, formation of via-conductors having a small diameter of 100 μm or less may be required for forming the mounting electrodes on which the recent IC chips can be mounted. In such a case, the amount of amorphous constituent of the unfired ceramic insulator which migrate into the unfired via-conductors per volume of the via-conductors is large compared with the case where the via-conductors have a diameter of more than 100 μm. Consequently, when the amorphous constituent rises to the end portions of the via-conductors, the end portions are substantially completely covered with the amorphous constituent. This makes it difficult to form the mounting electrodes by plating.

Accordingly, an object of the present invention is to provide a ceramic wiring board that reduces the likelihood of the amorphous constituent rising to the end portions of the via-conductors and enables the mounting electrodes to be formed by plating with certainty and ease and a method for producing the ceramic wiring board.

In the present invention, an attempt is made to improve the constituents of the conductive paste constituting the via-conductors in order to reduce the likelihood of the amorphous constituent rising to the end portions of the via-conductors. As a result, an attempt is made to improve the structure of portions of the ceramic insulator which are located in the vicinities of the via-conductors.

The present invention is directed to a ceramic wiring board.

A ceramic wiring board according to the present invention is a ceramic wiring board including a ceramic insulator and a via-conductor formed in the ceramic insulator. The ceramic insulator includes a crystalline constituent and an amorphous constituent. The via-conductor includes a metal and an oxide. The crystalline constituent of the ceramic insulator and the oxide included in the via-conductor include a metal element in common. The ceramic insulator includes a tubular region having a thickness of 5 μm. The tubular region adjoins to the via-conductor so as to surround the via-conductor. The tubular region has a higher concentration of the metal element than a region of the ceramic insulator which is other than the tubular region.

In the above-described ceramic wiring board, the tubular region of the ceramic insulator has a higher concentration of the metal element than a region of the ceramic insulator which is other than the tubular region. This is because the ions of the metal element constituting the oxide included in the via-conductor diffuse into the amorphous constituent of the ceramic insulator when the unfired ceramic wiring board is fired. Since the solid solubility limit is small, the ions of the metal element react with the amorphous constituent and a part of the amorphous constituent precipitates in the form of a crystalline constituent.

Consequently, in the above ceramic wiring board, the content of the amorphous constituent in the tubular region is reduced. Furthermore, since the metal element (e.g., an alkaline-earth metal element) included in the amorphous constituent, which reduces the viscosity of the amorphous constituent molten at high temperatures is incorporated into the crystalline constituent when the ions of the metal element react with the amorphous constituent to form a crystalline constituent, the residual amorphous constituent has a high viscosity at high temperatures.

This reduces the amount of amorphous constituent that migrates from the unfired ceramic insulator into the unfired via-conductor when the unfired ceramic wiring board is fired and limits the likelihood of the amorphous constituent rising to the end portion of the via-conductor. As a result, the mounting electrodes can be formed on the ceramic wiring board by plating with certainty and ease. In addition, the diffusion of the ions of the metal element constituting the oxide included in the via-conductor into the amorphous constituent of the ceramic insulator improves the bond between the via-conductor and the ceramic insulator and reduces the likelihood of the via-conductor detaching from the ceramic insulator.

The ceramic wiring board according to the present invention preferably has the following features. Specifically, when the degree of basicity BMi-O of the oxide included in the via-conductor is represented by Expressions (1) and (2) below, the absolute value of the difference in the degree of basicity between the amorphous constituent of the ceramic insulator and the oxide included in the via-conductor is 0.049 or less.

$$B_{Mi-O} = \frac{B_{Mi-O_0} - B_{Si-O_0}}{B_{Ca-O_0} - B_{Si-O_0}} \quad (1)$$

When the oxide includes a plurality of cationic constituents, $$B = \sum_i n_i B_{Mi-O}$$

(where $n_i$ represents the compositional proportion of a cation $M_i$)

$$B_{Mi-O_0} = \frac{(r_{Mi} + 1.4)^2}{2Z_{Mi}} \quad (2)$$

In Expressions (1) and (2) above, $B_{Mi-O_0}$ is the oxygen-donating ability of MiO, where MiO represents the oxide of an element; $B_{Si-O_0}$ is the oxygen-donating ability of $SiO_2$; $B_{Ca-O_0}$ is the oxygen-donating ability of CaO; $r_{Mi}$ is the ionic radius (Å) of the cation Mi; and $Z_{Mi}$ is the valence of the cation Mi. The ionic radius of the cation Mi is the Pauling's ionic radius of the cation Mi. The calculated BMi-O is rounded to four decimal places.

In the above-described ceramic wiring board, since the difference in the degree of basicity between the oxide included in the via-conductor and the amorphous constituent of the ceramic insulator is small (0.049 or less), only a trace amount of oxide can dissolve in the amorphous constituent. Consequently, the oxide diffused in the amorphous constituent becomes unstable, which promotes crystallization. Therefore, in the above-described ceramic wiring board, the amount of amorphous constituent of the tubular region is small with certainty. Moreover, the remaining amorphous constituent has a high viscosity at high temperatures with certainty.

This reduces the amount of amorphous constituent that migrates from the unfired ceramic insulator into the unfired via-conductor when the unfired ceramic wiring board is fired and limits the likelihood of the amorphous constituent rising to the end portion of the via-conductor with certainty. As a result, the mounting electrodes can be formed on the ceramic wiring board by plating with further certainty and ease.

The ceramic wiring board according to the present invention preferably has the following feature. Specifically, the tubular region includes a crystalline constituent including the metal element, which is included in the crystalline constituent of the ceramic insulator and the oxide included in the via-conductor in common.

In the above-described ceramic wiring board, the tubular region includes a crystalline constituent including the above metal element. That is, the content of amorphous constituent in the tubular region is small with certainty. Furthermore, the remaining amorphous constituent has a high viscosity at high temperatures with certainty.

This reduces the amount of amorphous constituent that migrates from the unfired ceramic insulator into the unfired via-conductor when the unfired ceramic wiring board is fired and limits the likelihood of the amorphous constituent rising to the end portion of the via-conductor with certainty. As a result, the mounting electrodes can be formed on the ceramic wiring board by plating with certainty and ease.

The ceramic wiring board in which the tubular region includes the crystalline constituent including the metal element, which is included in the crystalline constituent of the ceramic insulator and the oxide included in the via-conductor in common, further preferably has the following feature. Specifically, the metal element included in the crystalline constituent of the ceramic insulator and the oxide included in the via-conductor in common is Ti.

In the above-described ceramic wiring board, the crystalline constituent of the ceramic insulator and the oxide included in the via-conductor include Ti in common. Since the amount of Ti soluble in the amorphous constituent is small, Ti is likely to act as a crystal nucleus when the crystalline constituent is precipitated in the amorphous constituent. Thus, using Ti as a metal element included in the crystalline constituent and the oxide in common effectively reduces the amount of amorphous constituent that migrates from the unfired ceramic insulator into the unfired via-conductor when the unfired ceramic wiring board is fired and limits the likelihood of the amorphous constituent rising to the end portion of the via-conductor with certainty. As a result, the content of the oxide included in the via-conductor can be reduced. This reduces the resistance of the via-conductor and enables the mounting electrodes to be effectively formed on the ceramic wiring board by plating.

The ceramic wiring board in which the metal element, which is included in the crystalline constituent of the ceramic insulator and the oxide included in the via-conductor in common, is Ti further preferably has the following feature. Specifically, the crystalline constituent including the metal element, which is included in the crystalline constituent of the ceramic insulator and the oxide included in the via-conductor in common, includes a fresnoite compound including Ba, Ti, and Si.

In the above-described ceramic wiring board, the crystalline constituent including the above metal element includes a fresnoite compound. The fresnoite compound further improves the bond between the via-conductor and the ceramic insulator and, in turn, reduces the likelihood of the via-conductor detaching from the ceramic insulator with certainty.

The ceramic wiring board including the tubular region including the crystalline constituent including the metal element, which is included in the crystalline constituent of the ceramic insulator and the oxide included in the via-conductor in common, further preferably has the following feature. Specifically, the metal element included in the crystalline constituent of the ceramic insulator and the oxide included in the via-conductor in common is Al.

In the case where the crystalline constituent of the ceramic insulator and the oxide included in the terminal electrode include Al in common, Al is considered to also reduce the amount of amorphous constituent that migrates from the unfired ceramic insulator into the unfired via-conductor when the unfired ceramic wiring board is fired.

Thus, in the above ceramic electronic component, the likelihood of the amorphous constituent rising to the end portion of the via-conductor is reduced with certainty. As a result, the content of the oxide included in the via-conductor can be reduced. This reduces the resistance of the via-conductor and enables the mounting electrodes to be effectively formed on the ceramic wiring board by plating.

The ceramic wiring board in which the metal element included in the crystalline constituent of the ceramic insulator and the oxide included in the via-conductor in common is Al further preferably has the following feature. Specifically, the crystalline constituent including the metal element, which is included in the crystalline constituent of the ceramic insulator and the oxide included in the via-conductor in common, includes a celsian compound including Ba, Al, and Si.

In the above-described ceramic wiring board, the crystalline constituent including the above metal element includes a fresnoite compound. The fresnoite compound further improves the bond between the via-conductor and the ceramic insulator and reduces, with certainty, the likelihood of the via-conductor detaching from the ceramic insulator.

The ceramic wiring board according to the present invention preferably has the following feature. Specifically, the via-conductor has a diameter of 100 μm or less.

In the above ceramic wiring board, the via-conductor has a diameter of 100 μm or less. That is, even when the via-conductor has a small diameter in order to increase the number of the mounting electrodes included in the ceramic wiring board and reduce the pitch at which the mounting electrodes are arranged, the end portion is not covered with the amorphous constituent and the mounting electrodes can be formed on the ceramic wiring board by plating with certainty and ease.

The ceramic wiring board according to the present invention preferably has the following feature. Specifically, the via-conductor is exposed at the surface of the ceramic wiring board.

In the above-described ceramic wiring board, the via-conductor is exposed at the surface of the ceramic wiring board. That is, even in such a case, the mounting electrodes can be formed on the ceramic wiring board by plating with certainty and ease, since the likelihood of the amorphous constituent rising to the end portion of the via-conductor is limited.

The present invention is also directed to a method for producing the ceramic wiring board.

The method for producing the ceramic wiring board according to the present invention is a method for producing a ceramic wiring board including a ceramic insulator and a via-conductor. The method includes the first to sixth steps described below.

The first step is a step in which green sheets including a raw-material powder of the ceramic insulator are prepared. The second step is a step in which a via-hole is formed in at least one of the green sheets so as to penetrate the green sheet. The third step is a step in which a conductive paste including a metal powder, an additive including a metal element that is also included in the raw-material powder of the ceramic insulator in common, and an organic vehicle is prepared. The fourth step is a step in which the via-hole is filled with the conductive paste. The fifth step is a step in which the green sheets including the green sheet having the via-hole filled with the conductive paste are stacked on top of one another to form an unfired ceramic wiring board including an unfired ceramic insulator and an unfired via-conductor.

The sixth step is a step in which the unfired ceramic wiring board is fired in order to sinter the unfired ceramic insulator into a ceramic insulator including a crystalline constituent including the metal element and an amorphous constituent and to sinter the unfired via-conductor into a via-conductor including a metal and an oxide. The metal element is diffused in the amorphous constituent in order to make the concentration of the metal element in a tubular region of the ceramic insulator which adjoins to the via-conductor so as to surround the via-conductor and has a thickness of 5 μm higher than the concentration of the metal element in a region of the ceramic insulator which is other than the tubular region.

The above-described method for producing a ceramic wiring board includes the first to sixth steps. This reduces the amount of amorphous constituent that migrates from the unfired ceramic insulator into the unfired via-conductor when the unfired ceramic wiring board is fired and limits the likelihood of the amorphous constituent rising to the end portion of the via-conductor. As a result, the mounting electrodes can be formed on the ceramic wiring board by plating with certainty and ease.

In addition, the diffusion of the ions of the metal element constituting the oxide included in the via-conductor into the amorphous constituent of the ceramic insulator improves the bond between the via-conductor and the ceramic insulator and reduces the likelihood of the via-conductor detaching from the ceramic insulator.

The method for producing a ceramic wiring board according to the present invention preferably has the following feature. Specifically, the raw-material powder of the ceramic insulator includes a compound containing $SiO_2$, $Al_2O_3$, $TiO_2$, and Ba.

In the above-described method for producing a ceramic wiring board, the raw-material powder of the ceramic insulator includes a compound containing $SiO_2$, $Al_2O_3$, $TiO_2$, and Ba. Consequently, a fresnoite compound and a celsian compound are formed in the ceramic insulator produced by the reaction and sintering of the raw materials. This enables a ceramic wiring board having a high strength to be produced.

The method for producing a ceramic wiring board according to the present invention preferably has the following feature. Specifically, the additive included in the conductive paste is at least one selected from a $TiO_2$ powder and an $Al_2O_3$ powder.

In the case where the additive included in the conductive paste is at least one selected from a $TiO_2$ powder and an $Al_2O_3$ powder, when Ti ions and Al ions are diffused from the additive into the amorphous constituent, Ti and Al cause a crystalline constituent including Ti and a crystalline constituent including Al to precipitate in the amorphous constituent, respectively, since the amounts of Ti and Al soluble in the amorphous constituent are small. The amorphous constituent contributes to the precipitation of the crystalline constituent together with Ti and Al. Ti is likely to act as a crystal nucleus when the crystalline constituent is precipitated in the amorphous constituent because the amount of Ti soluble in the amorphous constituent is particularly small.

Accordingly, the above-described method for producing a ceramic electronic component effectively reduces the amount of amorphous constituent that migrates from the unfired ceramic insulator into the unfired via-conductor when the unfired electronic component is fired and certainly suppresses covering the end portion of the via-conductor with the amorphous constituent. As a result, the content of the oxide included in the via-conductor can be reduced. This reduces the resistance of the via-conductor and enables effective formation of a plating film on the end portion of the via-conductor.

The method for producing a ceramic wiring board in which the additive included in the conductive paste is at least one selected from a $TiO_2$ powder and an $Al_2O_3$ powder further preferably has the following feature. Specifically, the $TiO_2$ powder and $Al_2O_3$ powder have a specific surface area of 10 $m^2/g$ or more.

In the above-described method for producing a ceramic wiring board, the $TiO_2$ powder and the $Al_2O_3$ powder included in the conductive paste have a specific surface area of 10 $m^2/g$ or more. Increasing the specific surface areas of the $TiO_2$ powder and the $Al_2O_3$ powder increases the reactivity of the surfaces of the powder particles and makes it possible to increase the amounts of Ti ions and Al ions diffused even when the amounts of the $TiO_2$ powder and $Al_2O_3$ powder added to the conductive paste are small. Consequently, large amounts of fine crystalline constituent particles including the fresnoite compound and the celsian compound can be formed in the tubular region that adjoins to the via-conductor so as to surround the via-conductor.

This further effectively reduces the amount of amorphous constituent that migrates from the unfired ceramic insulator into the unfired via-conductor when the unfired ceramic wiring board is fired and limits the likelihood of the amorphous constituent rising to the end portion of the via-conductor with certainty. As a result, the content of the oxide included in the via-conductor can be reduced. This reduces the resistance of the via-conductor and enables the mounting electrodes to be effectively formed on the ceramic wiring board by plating.

The method for producing a ceramic wiring board according to the present invention preferably has the following feature. Specifically, the additive included in the conductive paste is at least one selected from a Ti-containing organic compound and an Al-containing organic compound.

In the above-described method for producing a ceramic wiring board, the additive included in the conductive paste is at least one selected from a Ti-containing organic compound and an Al-containing organic compound. When the unfired ceramic wiring board is fired, the Ti-containing organic compound or the Al-containing organic compound is combusted and oxidized into fine $TiO_2$ or $Al_2O_3$ particles having a markedly large specific surface area. Thus, the diffusibility of the Ti ions and the Al ions is high. This enables large amounts of fine crystalline constituent particles including the fresnoite compound and the celsian compound to be formed in the tubular region that adjoins to the via-conductor so as to surround the via-conductor even when the amounts of the $TiO_2$ powder and $Al_2O_3$ powder added to the conductive paste are small.

This further effectively reduces the amount of amorphous constituent that migrates from the unfired ceramic insulator into the unfired via-conductor when the unfired ceramic wiring board is fired and limits the likelihood of the amorphous constituent rising to the end portion of the via-conductor with certainty. As a result, the content of the oxide included in the via-conductor can be reduced. This reduces the resistance of the via-conductor and enables the mounting electrode to be effectively formed on the ceramic wiring board by plating.

The method for producing a ceramic wiring board according to the present invention preferably has the following feature. Specifically, the sixth step includes a substep in which holding at a temperature of $T_1$° C. or more and $(T_1+50)$° C. or less is performed for 1 hour or more, and a substep in which holding at a predetermined temperature higher than $(T_1+50)$° C. is performed for 1 hour or more, where $T_1$ represents the sintering-starting temperature (° C.) of the unfired ceramic insulator.

In the above-described method for producing a ceramic wiring board, the sixth step is a step in which firing is performed in accordance with the predetermined temperature profile. Performing firing in accordance with the temperature profile enables at least one metal element contained in the additive included in the unfired via-conductor to effectively diffuse into the amorphous constituent and causes the crystalline constituent to precipitate.

This reduces the amount of amorphous constituent that migrates from the unfired ceramic insulator into the unfired via-conductor when the unfired ceramic wiring board is fired and limits the likelihood of the amorphous constituent rising to the end portion of the via-conductor. As a result, the mounting electrodes can be formed on the ceramic wiring board by plating with certainty and ease.

The method for producing a ceramic wiring board according to the present invention in which the sixth step is a step in which firing is performed in accordance with the above-described predetermined temperature profile further preferably has the following feature. Specifically, the fifth step includes a substep in which a shrinkage-reduction green sheet is stacked on each of the principal planes of the unfired ceramic wiring board, the shrinkage-reduction green sheet including a raw-material powder that is a powder of a shrinkage-reducing material that does not become sintered or shrink at $(T_1+50)°$ C.

In the above-described method for producing a ceramic wiring board, the fifth step further includes a substep in which the shrinkage-reduction green sheet is stacked on each of the principal planes of the unfired ceramic wiring board. That is, the unfired ceramic wiring board is interposed between the shrinkage-reduction green sheets. This reduces the shrinkage of the ceramic wiring board in the principal-plane direction which occurs when the ceramic wiring board is fired.

As a result, the accuracy of the dimensions of the fired ceramic wiring board can be increased. Furthermore, in the case where the end portion of the via-conductor, which is formed in the ceramic wiring board, is exposed at the principal plane of the ceramic wiring board, the amount of end portion of the via-conductor which protrudes from the principal plane of the ceramic wiring board can be reduced.

In the ceramic wiring board according to the present invention, the concentration of the metal element, which is included in the crystalline constituent of the ceramic insulator and the oxide included in the via-conductor in common, in the tubular region of the ceramic insulator which adjoins to the via-conductor so as to surround the via-conductor is made to be higher than the concentration of the metal element in a region of the ceramic insulator which is other than the tubular region. This limits the likelihood of the amorphous constituent rising to the end portion of the via-conductor. As a result, the mounting electrodes can be formed on the ceramic wiring board by plating with certainty and ease. Furthermore, the bond between the via-conductor and the ceramic insulator is improved, which reduces the likelihood of the via-conductor detaching from the ceramic insulator.

In the method for producing a ceramic wiring board according to the present invention, a crystalline constituent is precipitated in the amorphous constituent when the unfired ceramic wiring board is fired. This reduces the amount of residual amorphous constituent and increases the viscosity of the amorphous constituent at high temperatures. As a result, the likelihood of the amorphous constituent rising to the end portion of the via-conductor can be limited. Furthermore, the ions of the metal element constituting the oxide included in the via-conductor are diffused into the amorphous constituent of the ceramic insulator. This improves the bond between the via-conductor and the ceramic insulator and reduces the likelihood of the via-conductor detaching from the ceramic insulator.

BRIEF DESCRIPTION OF THE DRAWINGS

FIG. 11 is a diagram schematically illustrating a cross section of a ceramic wiring board 200 described in the related art.

DETAILED DESCRIPTION OF THE PREFERRED EMBODIMENTS

The features of the present invention are described more in detail with reference to embodiments of the present invention.

—Ceramic Wiring Board According to One Embodiment—

A ceramic wiring board 100 according to an embodiment of the present invention is described below with reference to FIG. 1. The ceramic wiring board 100 is used as a wiring board on which active components such as an IC chip and passive components such as a capacitor are mounted and wired to one another to form a module.

Figure 1:
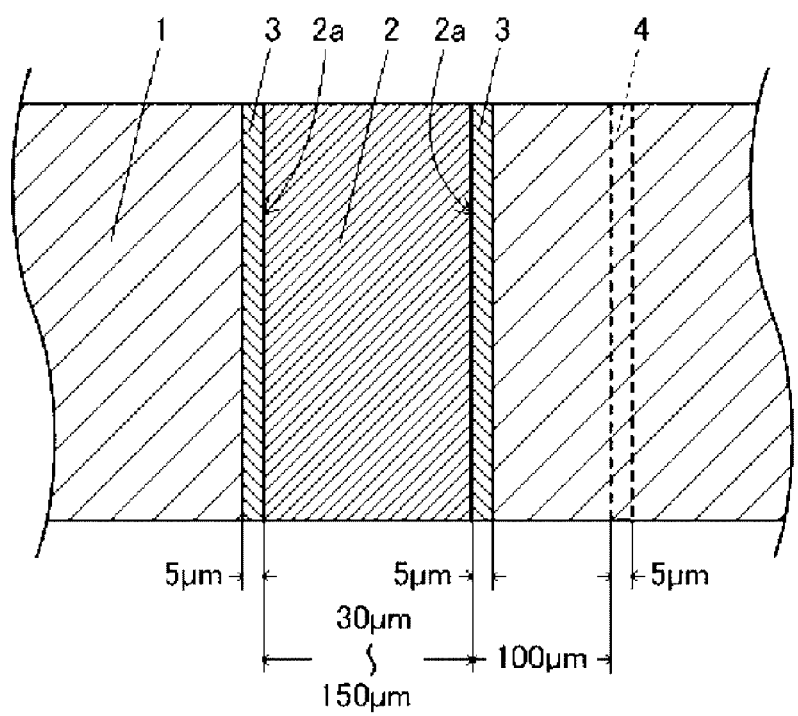
FIG. 1 is a diagram schematically illustrating a cross section of a ceramic wiring board 100 according to an embodiment of the present invention.

FIG. 1 is a diagram schematically illustrating a cross section of the ceramic wiring board 100. The ceramic wiring board 100 includes a ceramic insulator 1 and a via-conductor 2. In this embodiment, the ceramic insulator 1 includes, as described below, $SiO_2$, $Al_2O_3$, celsian ($BaAl_2Si_2O_8$), and fresnoite ($Ba_2TiSi_2O_8$) that serve as crystalline constituents. The ceramic insulator 1 also includes a glass constituent including oxides of Si, Ba, Mn, Al, Ti, Zr, and Mg which serve as an amorphous constituent. The via-conductor 2 includes, as described below, a metal that is Cu and an oxide that is $TiO_2$ or $Al_2O_3$. The via-conductor 2 is cylindrical. That is, in this embodiment, the crystalline constituents of the ceramic insulator 1 and the oxide included in the via-conductor 2 include Ti or Al in common.

FIG. 1 is a cross-sectional view of the ceramic wiring board 100 which is taken along a plane containing the diameter of the via-conductor 2. An interface 2a between the ceramic insulator 1 and the via-conductor 2, a tubular region 3 of the ceramic insulator 1 which adjoins to the via-conductor 2 so as to surround the via-conductor 2, and a region 4 of the ceramic insulator 1 which is other than the tubular region are defined by the following method.

Specifically, the ceramic wiring board 100 is ground with a mechanical grinder to a plane containing the diameter of the via-conductor 2 in order to expose a cross section of the ceramic wiring board 100. The cross section of the ceramic wiring board 100 is subsequently subjected to a flat milling process, followed by carbon coating. Subsequently, elementary analysis is conducted using a WDX (wavelength dispersive X-ray spectroscopy) measuring device (product name: JXA-8530F, produced by JEOL Ltd.). Table 1 summarizes the conditions under which WDX is conducted.

TABLE 1

| Device | | Condition |
|---|---|---|
| Electron optics system | Beam current | $5 \times 10^{-8}$ A |
| | Accelerating voltage | 15 kV |
| | Scanning method | Stage scanning (one way) |
| | Dwell Time | 40 ms |
| | Pixel number | 256 × 256 |
| | Pixel size | 0.18 μm |
| Spectrometer | Dispersive crystal | LiFH |

The Cu intensity contained in the results of the WDX measurement is converted into ASCII data, and the position at which the Cu intensity reaches less than 600 is defined as the interface 2a between the ceramic insulator 1 and the via-conductor 2. In this embodiment, as described below, four types of via-conductors 2 having diameters of 30 μm, 50 μm, 100 μm, and 150 μm are formed. The diameter of each via-conductor 2 is considered to be the interval between the two interfaces 2a and 2a defined as described above.

A region of the ceramic insulator 1 which extends 5 μm from the interface 2a as illustrated in FIG. 1 is defined as a tubular region 3 that adjoins to the via-conductor so as to surround the via-conductor. A region of the ceramic insulator 1 which extends 5 μm from a position 100 μm from the interface 2a is defined as a region 4 other than the tubular region.

In this embodiment, the tubular region 3 of the ceramic insulator 1 which adjoins to the via-conductor 2 so as to surround the via-conductor 2 and has a thickness of 5 μm has a higher concentration of Ti than the region 4 other than the tubular region. In order to clarify that, a test was conducted in this embodiment. The specific results of the test are described below. In the following descriptions, a method for producing samples used in the test is cited as a method for producing the ceramic wiring board 100.

<First Step (Green Sheet-Preparing Step)>

Figure 2:
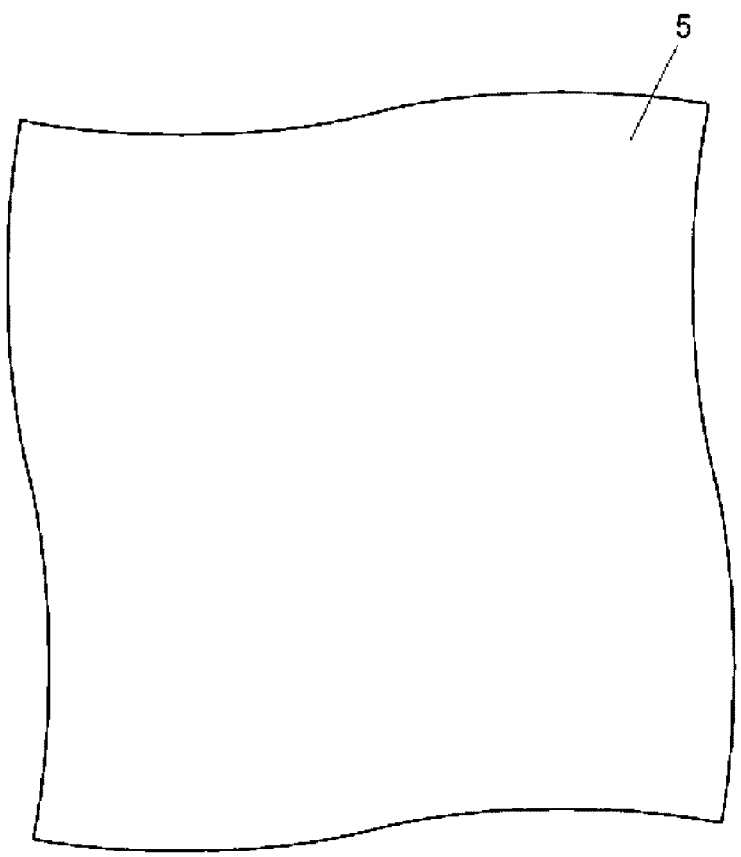
FIG. 2 is a diagram used for explaining an example of a method for producing the ceramic wiring board 100 illustrated in FIG. 1, schematically illustrating a green sheet 5 prepared in a first step (green sheet-preparing step).

A method for producing the ceramic wiring board 100 is described below with reference to FIGS. 2 to 5. FIG. 2 is a diagram schematically illustrating a green sheet 5 prepared in the first step (green sheet-preparing step).

A method for preparing the green sheet 5 is described below. As starting materials, powders of $SiO_2$, $Al_2O_3$, $BaCO_3$, $ZrO_2$, $TiO_2$, $Mg(OH)_2$, and $MnCO_3$ each having a particle diameter of 2.0 μm or less were prepared. The powders of the starting materials were weighed such that predetermined compositional proportions were achieved and subjected to wet milling. The resulting crushed material was dried. Thus, a mixture was prepared. The mixture was subjected to a heat treatment in a reducing atmosphere at a predetermined temperature (e.g., 700° C. to 900° C.) for a predetermined amount of time (e.g., 30 to 300 minutes) to form a raw-material powder of the green sheet 5 used for producing the ceramic insulator. In this heat treatment, $BaCO_3$ was converted into BaO, $Mg(OH)_2$ was converted into MgO, and $MnCO_3$ was converted into MnO.

To the raw-material powder of the green sheet 5, an organic binder, a dispersant, and a plasticizer were added. The resulting mixture was subjected to milling such that the average-particle diameter ($D_{50}$) of the raw-material powder was 1.5 μm or less to form a ceramic slurry. The ceramic slurry was formed into a sheet-like shape on a base film by a doctor-blade method. The resulting sheet was dried. Thus, a green sheet 5 having a certain thickness that was controlled to become 20 μm after the green sheet had been fired was prepared.

The green sheet 5 was used for determining the sintering-starting temperature $T_1$(° C.) of the unfired ceramic insulator 8 (see FIG. 5) described below and the shrinkage of the unfired ceramic wiring board 10 (see FIG. 5) in the principal-plane direction. The green sheet 5 was also used for identifying the types of crystalline constituents formed after the unfired ceramic insulator 8 had been sintered.

A method for measuring the sintering-starting temperature $T_1$(° C.) of the unfired ceramic insulator 8 is described below. Ten green sheets 5 described above were pressure-bonded to one another to form a sample used for measuring the sintering-starting temperature of the unfired ceramic insulator 8. The sample was heated from the room temperature to 1000° C. at a rate of temperature increase of 2° C./min with a TMA (thermomechanical analysis) device (produced in-house) that had been controlled to have an atmosphere containing $N_2/H_2O/H_2$ such that the oxidation of Cu did not occur.

By defining the shrinkage (%) of the sample in the thickness direction to be $[(t_1-t_0)/t_0] \times 100$ on the basis of the results of the TMA measurement, where $T_0$ represents the initial thickness of the sample and $t_1$ represents the thickness of the sample at a specific temperature, the temperature at which the shrinkage of the sample in the thickness direction reached −10% was considered to be the sintering-starting temperature. As a result, the sintering-starting temperature $T_1$ of the unfired ceramic insulator 8 prepared in this embodiment was 900° C.

A method for measuring the shrinkage of the unfired ceramic wiring board 10 in the principal-plane direction is described below. The green sheets 5 that had been cut into the same shape as described above were pressure-bonded to one another in the same number to form a sample used for measuring the shrinkage of the unfired ceramic wiring board 10 in the principal-plane direction. The sample was heated from the room temperature to a predetermined temperature (e.g., 900° C. to 1000° C.) at a rate of temperature increase of 2° C./min in a firing furnace (produced in-house) that had been controlled to have an atmosphere containing $N_2/H_2O/H_2$ such that the oxidation of Cu did not occur. The heated sample was maintained at the predetermined temperature for a predetermined amount of time (e.g., 60 to 300 minutes) and subsequently cooled to the room temperature.

By defining the shrinkage (%) of the sample in the principal-plane direction to be $[(L_1-L_0)/L_0] \times 100$, where $L_0$ represents the perimeter of the sample which was measured before the sample had been fired and $L_1$ represents the perimeter of the sample which was measured after the sample had been fired, the shrinkage of the sample in the principal-plane direction was calculated. As a result, the shrinkage of the unfired ceramic wiring board 10 prepared in this embodiment in the principal-plane direction was −5%.

The identification of the types of the crystalline constituents formed after the unfired ceramic insulator 8 had been sintered is described below. The green sheets 5 that had been cut into the same shape as described above were thermo-compression-bonded in the same number under the same conditions as described above to form a sample used for the identification of the types of the crystalline constituents. The sample was heated from the room temperature to a predetermined temperature (e.g., 900° C. to 1000° C.) at a rate of temperature increase of 2° C./min in a firing furnace (produced in-house) that had been controlled to have an atmosphere containing $N_2/H_2O/H_2$ such that the oxidation of Cu did not occur. The heated sample was maintained at the predetermined temperature for a predetermined amount of time (e.g., 60 to 300 minutes) and subsequently cooled to the room temperature. The fired sample was crushed into a powder.

The powder sample was analyzed by X-ray diffraction with a diffractometer using Cu-Kα radiation as a measurement X-ray. As a result, the crystalline constituents formed after the unfired ceramic insulator 8 had been sintered in this embodiment were identified to be $SiO_2$, $Al_2O_3$, celsian, and fresnoite.

<Second Step (Via-Hole-Forming Step)>

Figure 3:
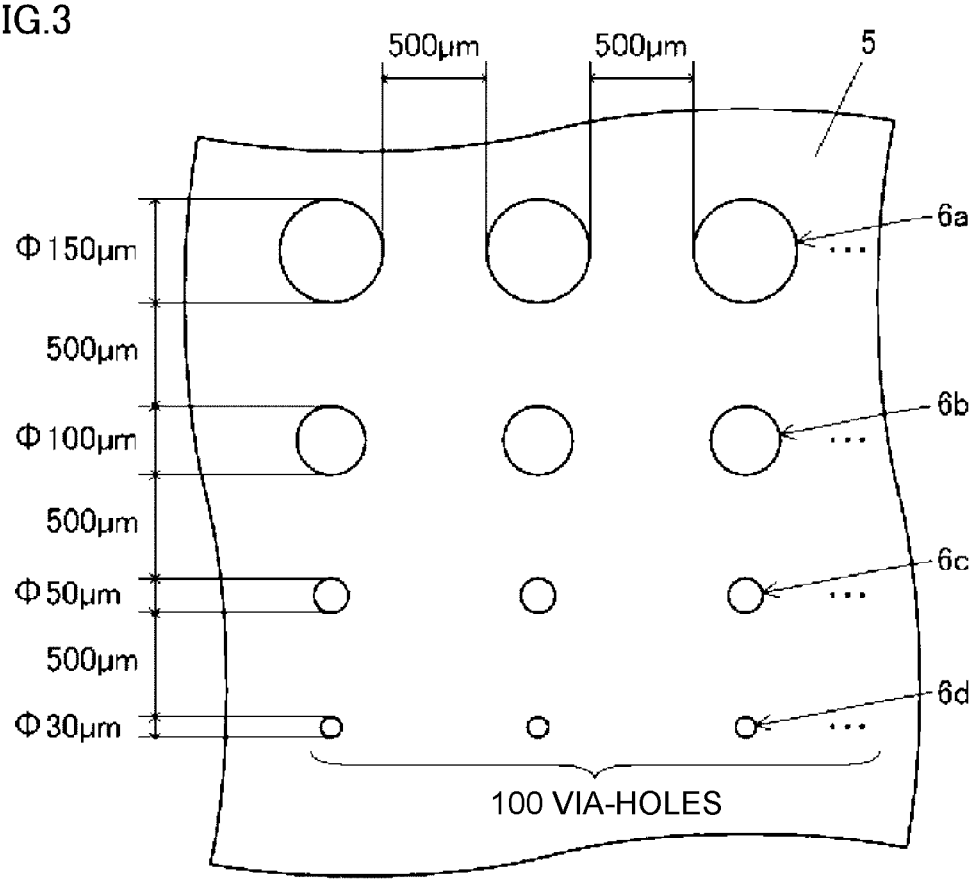
FIG. 3 is a diagram used for the same purpose as in FIG. 2, schematically illustrating a green sheet 5 prepared in a second step (via-hole-forming step), the green sheet 5 having via-holes 6a to 6d formed therein.

FIG. 3 is a diagram schematically illustrating a green sheet 5 prepared in the second step (via-hole-forming step), in which via-holes 6a to 6d were formed. The green sheet 5 prepared in the first step was irradiated with a laser beam in order to form, in the green sheet, via-holes 6a to 6d that penetrate the green sheet in the thickness direction as illustrated in FIG. 3.

The via-holes 6a to 6d are formed such that unfired via-conductors 9a to 9d (see FIG. 5), which are formed by filling the via-holes 6a to 6d with the conductive paste 7 described below, have diameters of 30 μm, 50 μm, 100 μm, and 150 μm, respectively, after being fired. For each of the via-holes 6a to 6d, 100 via-holes are formed in one green sheet such that the interval between each pair of adjacent via-holes becomes 500 μm after the green sheet has been fired.

<Third Step (Conductive Paste-Preparing Step)>

The preparation of the conductive paste charged into the via-holes 6a to 6d formed in the green sheet 5 in the second step is described. As starting materials, the metal powder shown in Table 2, the oxide powders shown in Table 3, the organic compounds shown in Table 4, and an organic vehicle including an ethylcellulose resin were prepared.

TABLE 2

| Metal powder Type No. | Type | $D_{10}$ (μm) | $D_{50}$ (μm) | $D_{90}$ (μm) | SSA ($m^2/g$) | True specific gravity |
|---|---|---|---|---|---|---|
| K-1 | Cu | 0.28 | 3.8 | 5.4 | 0.25 | 8.90 |

TABLE 3

| Oxide powder Type No. | Type | New specific gravity | SSA ($m^2/g$) |
|---|---|---|---|
| AI-1 | $TiO_2$ | 3.70 | 5 |
| AI-2 | $TiO_2$ | 3.70 | 10 |
| AI-3 | $TiO_2$ | 3.70 | 30 |
| AI-4 | $TiO_2$ | 3.70 | 90 |
| * AI-5 | $SiO_2$ | 2.60 | 10 |
| * AI-6 | $Mn_3O_4$ | 4.90 | 10 |
| * AI-7 | $ZrO_2$ | 5.80 | 10 |
| AI-8 | $Al_2O_3$ | 3.90 | 10 |

*: Out of the range of the present invention

TABLE 4

| Organic compound Type No. | Type | Metal content (wt %) | True specific gravity |
|---|---|---|---|
| AO-1 | Organotitanium compound | 10 | 0.95 |
| AO-2 | Organoaluminium compound | 10 | 0.95 |

The particle size distribution ($D_{10}$, $D_{50}$, and $D_{90}$) shown in Table 2 was determined using a laser diffraction/scattering particle size distribution analyzer (LA series, produced by Horiba, Ltd.). The solvent used in the measurement was a mixture of ethyl alcohol and isopropyl alcohol. The SSA (specific surface area) shown in Tables 2 and 3 was measured with an SSA measuring device (product name: Macsorb (registered trademark), produced by Mountech Co., Ltd.) by single-point BET (Brunauer, Emmet, and Teller's equation) using an $N_2$ gas. The true specific gravity shown in Tables 3 and 4 was measured with a dry automatic densitometer using a He gas (product name: AccuPyc series, produced by Shimadzu Corporation) and a specific gravity cup (produced by Yasuda Seiki Seisakusho, Ltd.). The Ti content and Al content shown in Table 4 were measured with an ICP-AES (inductively coupled plasma atomic emission spectrometry device, produced by Shimadzu Corporation).

Conductive pastes of Conductive-Paste Composition Nos. P-1 to P-18 shown in Table 5 were each prepared by mixing the starting materials shown in Tables 2 to 4 with one another in the predetermined compositional proportions and subjecting the resulting mixture to a triple roll mill in order to perform dispersion.

TABLE 5

| Conductive paste Composition No. | Composition (vol %) | | | | | | | | | | |
|---|---|---|---|---|---|---|---|---|---|---|---|
| | Metal powder | Additive | | | | | | | | | Organic vehicle |
| | | Oxide powder | | | | | | | | Organic compound | |
| | K1 | AI-1 | AI-2 | AI-3 | AI-4 | AI-5 | AI-6 | AI-7 | AI-8 | AO-1 | OV-1 |
| P-1 | 49.0 | — | 1.0 | — | — | — | — | — | — | — | 50.0 |
| P-2 | 48.0 | — | 2.0 | — | — | — | — | — | — | — | 50.0 |
| P-3 | 45.0 | — | 5.0 | — | — | — | — | — | — | — | 50.0 |
| P-4 | 42.5 | — | 7.5 | — | — | — | — | — | — | — | 50.0 |
| P-5 | 46.0 | 4.0 | — | — | — | — | — | — | — | — | 50.0 |
| P-6 | 49.0 | — | — | 1.0 | — | — | — | — | — | — | 50.0 |
| P-7 | 49.5 | — | — | — | 0.5 | — | — | — | — | — | 50.0 |
| * P-8 | 48.0 | — | — | — | — | 2.0 | — | — | — | — | 50.0 |
| * P-9 | 42.5 | — | — | — | — | 7.5 | — | — | — | — | 50.0 |
| * P-10 | 48.0 | — | — | — | — | — | 2.0 | — | — | — | 50.0 |
| * P-11 | 42.5 | — | — | — | — | — | 7.5 | — | — | — | 50.0 |
| * P-12 | 48.0 | — | — | — | — | — | — | 2.0 | — | — | 50.0 |
| * P-13 | 42.5 | — | — | — | — | — | — | 7.5 | — | — | 50.0 |
| P-14 | 48.0 | — | — | — | — | — | — | — | 2.0 | — | 50.0 |
| P-15 | 42.5 | — | — | — | — | — | — | — | 7.5 | — | 50.0 |
| * P-16 | 50.0 | — | — | — | — | — | — | — | — | — | 50.0 |
| P-17 | 50.0 | — | — | — | — | — | — | — | — | 20.0 | 30.0 |
| P-18 | 50.0 | — | — | — | — | — | — | — | — | 20.0 | 30.0 |

* Out of the range of the present invention

<Fourth Step (Conductive Paste-Charging Step)>

Figure 4:
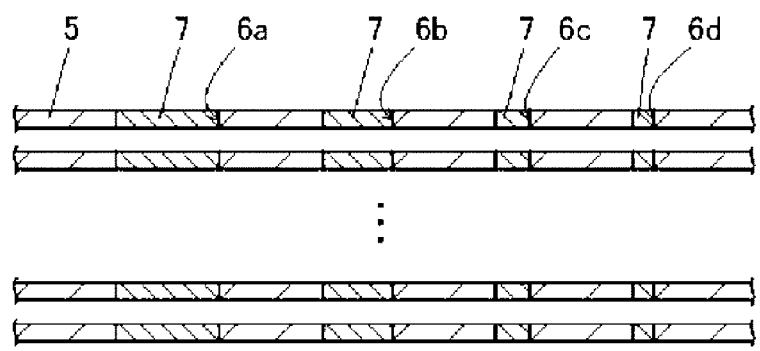
FIG. 4 is a diagram used for the same purpose as in FIG. 2, schematically illustrating green sheets 5 prepared in a fourth step (conductive paste-charging step), in which the via-holes 6a to 6d are filled with a conductive paste 7.

FIG. 4 is a diagram schematically illustrating green sheets 5 prepared in the fourth step (conductive paste-charging step), in which the via-holes 6a to 6d have been filled with the conductive paste 7. In the green sheets 5 illustrated in FIG. 4, the via-holes 6a to 6d formed in the second step were each filled with the conductive paste 7 prepared in the third step. The green sheets 5 were prepared in a predetermined number by the above-described method.

<Fifth Step (Green Sheet-Stacking Step)>

Figure 5:
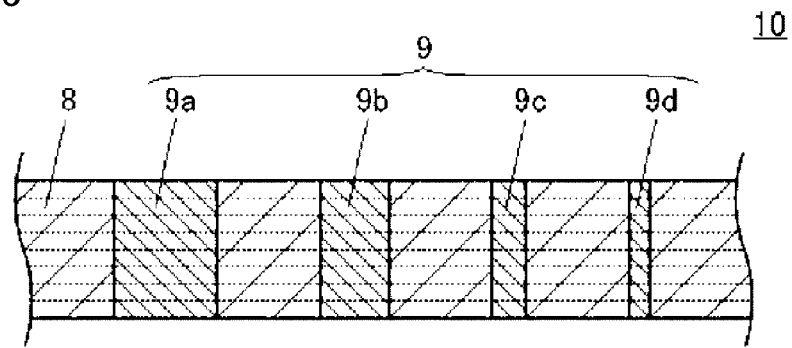
FIG. 5 is a diagram used for the same purpose as in FIG. 2, schematically illustrating an unfired ceramic wiring board 10 prepared in a fifth step (green sheet-stacking step).

FIG. 5 is a diagram schematically illustrating an unfired ceramic wiring board 10 prepared in the fifth step (green sheet-stacking step). The green sheets 5 prepared in the fourth step were stacked in the predetermined number on top of one another to form an unfired ceramic wiring board 10. The unfired ceramic wiring board 10 includes an unfired ceramic insulator 8 and unfired via-conductors 9. The unfired via-conductors 9a to 9d are constituted by layers formed of the conductive paste 7 charged in the via-holes 6a to 6d, respectively, which are stacked on top of one another to form a column.

<Sixth Step (Firing Step)>

The firing step in which the unfired ceramic wiring board 10 prepared in the fifth step is fired into a ceramic wiring board 100 is described below. The step of firing the unfired ceramic wiring board 10 includes the following five substeps.

The green, multilayer body is heated in a reducing atmosphere under predetermined conditions in order to decompose the organic binder and the like included in the unfired ceramic insulator 8 and the unfired via-conductors 9a to 9d (first substep). In the case where the unfired via-conductors 9a to 9d include an organic compound containing a metal (Conductive-Paste Composition Nos. P-17 and P-18), the organic compound is changed into a metal oxide in this step.

The heated multilayer body is subjected to a heat treatment in a reducing atmosphere under predetermined conditions in order to reduce the content of residual C in the unfired ceramic wiring board 10 to be less than 0.1 wt % (second substep).

In this step, the unfired ceramic insulator 8 is converted into a ceramic insulator 1 including crystalline constituents and an amorphous constituent, that is, a glass-ceramic insulator; and the unfired via-conductors 9 are converted into via-conductors 2. Subsequently, a substance generated by the oxide included in the unfired via-conductors 9a to 9d being partially reduced due to the combustion of the residual C in the second substep is reoxidized to a sufficient degree.

Subsequent to the third substep, a heat treatment is further performed in a reduced atmosphere under predetermined conditions in order to diffuse the oxide included in the via-conductors 9 into the amorphous constituent of the ceramic insulator 1 (fourth substep). As a result, the concentration of a metal element included in the crystalline constituents of the ceramic insulator 1 and the via-conductors 2 in common in the tubular regions 3 that adjoin to the respective via-conductors 2 so as to surround the via-conductors 2 becomes higher than in the regions 4 other than the tubular regions.

Figure 6:
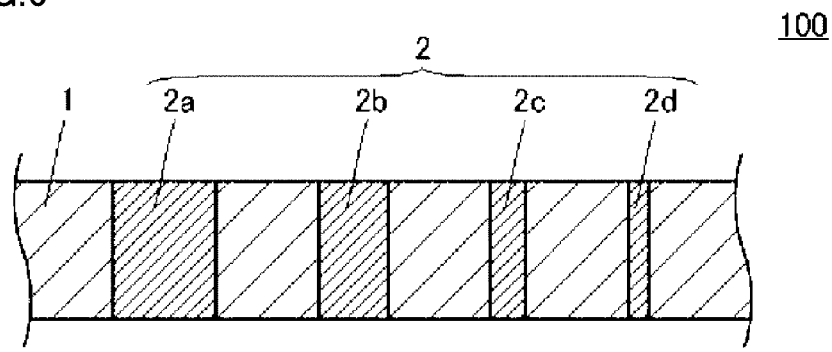
FIG. 6 is a diagram used for the same purpose as in FIG. 2, schematically illustrating a ceramic wiring board 100 prepared in a sixth step (firing step).

FIG. 6 is a diagram schematically illustrating a ceramic wiring board 100 prepared by the above-described steps, which includes the ceramic insulator 1 and the via-conductors 2a to 2d. In FIG. 6, the illustration of the tubular regions 3 is omitted.

The types of the crystalline constituents of the ceramic insulator 1 included in the ceramic wiring board 100 prepared by the above-described method were identified. The composition of the amorphous constituent of the ceramic insulator 1 was analyzed. The degree of basicity of the amorphous constituent of the ceramic insulator 1 was determined. Table 6 summarizes the results. Hereinafter, Test Specimen Nos. (S-1 to S-18) associated with the type of the conductive paste used are attached to the ceramic wiring boards 100 subjected to the various evaluations.

TABLE 6

| | | | Amorphous oxide | | | | | | | |
|---|---|---|---|---|---|---|---|---|---|---|
| | | | Composition of glass ceramic at position 250 μm from via conductor | | | | | | | |
| Test specimen No. | Conductive paste Composition No. | Crystalline oxide Type | Composition (mol %) | | | | | | | Basicity |
| | | | $SiO_2$ | BaO | MnO | $Al_2O_3$ | $TiO_2$ | $ZrO_2$ | MgO | |
| S-1 | P-1 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-2 | P-2 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-3 | P-3 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-4 | P-4 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-5 | P-5 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-6 | P-6 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-7 | P-7 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| * S-8 | P-8 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| * S-9 | P-9 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| * S-10 | P-10 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| * S-11 | P-11 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| * S-12 | P-12 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| * S-13 | P-13 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-14 | P-14 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-15 | P-15 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| * S-16 | P-16 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-17 | P-17 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |
| S-18 | P-18 | $SiO_2$, $Al_2O_3$, $BaAl_2SiO_8$, $Ba_2TiSi_2O_8$ | 82.89 | 6.96 | 3.34 | 2.41 | 2.06 | 1.32 | 1.02 | 0.1427 |

* Out of the range of the present invention

A method for identifying the types of the crystalline constituents of the ceramic insulator 1 is described below. The ceramic wiring board 100 was ground with a mechanical grinder to a plane containing the diameters of the via-conductors 2 in order to expose a cross section of the ceramic wiring board 100. The cross section of the ceramic wiring board 100 was subsequently subjected to a flat milling process. A thin piece was taken, by FIB (focused ion beam) processing, from the cross section of the ceramic wiring board 100 at a position 100 μm from the interface 2a between the ceramic insulator 1 and the via-conductor 2, which is defined above.

The thin piece was analyzed with an STEM (scanning transmission electron microscope/product name: HD-2300A produced by Hitachi, Ltd.) and an EDAX (energy dispersive X-ray spectrometry device/product name: Genesis XM4 produced by AMETEK, Inc.) in order to determine the presence of the crystalline constituents. Portions of the thin piece which had been identified to be crystalline constituents were analyzed by selected area electron diffraction with an FE-TEM (field-emission transmission electron microscope/product name: JEM-2200FS, produced by JEOL Ltd.). The interplanar spacings of various crystals were calculated from the resulting diffraction pattern, and crystalline constituents that corresponded with the interplanar spacings were determined by identification. Table 7 summarizes the conditions under which the STEM/EDAX analysis was conducted. The results of the above-described analysis are shown in the column "Type" of "Crystalline oxide" in Table 6.

TABLE 7

| Device | Condition | |
|---|---|---|
| STEM | Accelerating voltage | 200 kV |
| | Objective movable aperture | #2 |
| | Probe diameter | Normal Mode |
| | Pretreatment | Pt coating |

TABLE 7-continued

| Device | Condition | |
|---|---|---|
| EDX | Time constant | 12.8 μs |
| | Number of map integration | 16 |
| | Dwell Time | 500 |

A method for analyzing the composition of the amorphous constituent of the ceramic insulator 1 is described below. A thin piece prepared in the same manner as in the preparation of the thin piece used for identifying the types of the crystalline constituents was subjected to an EDX analysis with the above-described STEM/EDAX in order to determine the composition of the amorphous constituent. The results of the above-described analysis are shown in the column "Type" of "Amorphous oxide" in Table 6.

The degree of basicity of the amorphous constituent was determined by Expressions (1) and (2) below from the composition of the amorphous constituent which was determined by the EDX analysis. The results of the analysis are shown in the column "Basicity" of "Amorphous oxide" in Table 6.

$$B_{Mi-O} = \frac{B_{Mi-O_0} - B_{Si-O_0}}{B_{Ca-O_0} - B_{Si-O_0}} \quad (1)$$

When the amorphous constituent includes a plurality of cationic constituents, $$B = \sum_i n_i B_{Mi-O}$$

(where $n_i$ represents the compositional proportions of a cation $M_i$)

$$B_{Mi-O_0} = \frac{(r_{Mi} + 1.4)^2}{2Z_{Mi}} \qquad (2)$$

In Expressions (1) and (2) above, $BMi$-$O_0$ is the oxygen-donating ability of MiO, where MiO represents an oxide of an element; $BSi$—$O_0$ is the oxygen-donating ability of $SiO_2$; $BCa$—$O_0$ is the oxygen-donating ability of CaO; rMi is the ionic radius (Å) of a cation Mi; and ZMi is the valance of the cation Mi. The ionic radius of the cation Mi is the Pauling's ionic radius of the cation Mi. The calculated BMi-O is rounded to four decimal places.

The type of oxide included in the via-conductors 2 of the ceramic wiring board 100 prepared above was identified. The degree of basicity of the oxide was determined. Table 8 summarizes the results.

expose a cross section of the ceramic wiring board 100. The cross section of the ceramic wiring board 100 was subsequently subjected to a flat milling process. A thin piece was cut, by FIB processing, from the cross section of the via-conductor 2 at a position 10 to 100 μm from the principal plane of the ceramic wiring board 100. The thin piece was analyzed by the same method as in the identification of the types of the crystalline constituents of the ceramic insulator 1 in order to identify the types of the oxides interspaced in the above region. The results of the identification confirmed that the oxides detected were crystalline and had substantially the same composition. The results of the above analysis are shown in the column "Type" of "Crystalline oxide included in via-conductor" in Table 8.

The degree of basicity of the oxide confirmed by the above analysis was calculated by Expressions (1) and (2) above. The results of the analysis are shown in the column "Basicity" of "Crystalline oxide included in via-conductor" in Table 8.

TABLE 8

| | | Composition of crystalline oxide included in via conductor | | | | | | | |
|---|---|---|---|---|---|---|---|---|---|
| Test | Conductive paste | Type | | | | Basicity | | | |
| specimen No. | Composition No. | φ30 μm | φ50 μm | φ100 μm | φ150 μm | φ30 μm | φ50 μm | φ100 μm | φ150 μm |
| S-1 | P-1 | $TiO_2$ | $TiO_2$ | $TiO_2$ | $TiO_2$ | 0.1250 | 0.1250 | 0.1250 | 0.1250 |
| S-2 | P-2 | $TiO_2$ | $TiO_2$ | $TiO_2$ | $TiO_2$ | 0.1250 | 0.1250 | 0.1250 | 0.1250 |
| S-3 | P-3 | $TiO_2$ | $TiO_2$ | $TiO_2$ | $TiO_2$ | 0.1250 | 0.1250 | 0.1250 | 0.1250 |
| S-4 | P-4 | $TiO_2$ | $TiO_2$ | $TiO_2$ | $TiO_2$ | 0.1250 | 0.1250 | 0.1250 | 0.1250 |
| S-5 | P-5 | $TiO_2$ | $TiO_2$ | $TiO_2$ | $TiO_2$ | 0.1250 | 0.1250 | 0.1250 | 0.1250 |
| S-6 | P-6 | $TiO_2$ | $TiO_2$ | $TiO_2$ | $TiO_2$ | 0.1250 | 0.1250 | 0.1250 | 0.1250 |
| S-7 | P-7 | $TiO_2$ | $TiO_2$ | $TiO_2$ | $TiO_2$ | 0.1250 | 0.1250 | 0.1250 | 0.1250 |
| * S-8 | P-8 | $SiO_2$ | $SiO_2$ | $SiO_2$ | $SiO_2$ | 0 | 0 | 0 | 0 |
| * S-9 | P-9 | $SiO_2$ | $SiO_2$ | $SiO_2$ | $SiO_2$ | 0 | 0 | 0 | 0 |
| * S-10 | P-10 | MnO | MnO | MnO | MnO | 0.7850 | 0.7850 | 0.7850 | 0.7850 |
| * S-11 | P-11 | MnO | MnO | MnO | MnO | 0.7850 | 0.7850 | 0.7850 | 0.7850 |
| * S-12 | P-12 | $ZrO_2$ | $ZrO_2$ | $ZrO_2$ | $ZrO_2$ | 0.1829 | 0.1829 | 0.1829 | 0.1829 |
| * S-13 | P-13 | $ZrO_2$ | $ZrO_2$ | $ZrO_2$ | $ZrO_2$ | 0.1829 | 0.1829 | 0.1829 | 0.1829 |
| S-14 | P-14 | $Al_2O_3$ | $Al_2O_3$ | $Al_2O_3$ | $Al_2O_3$ | 0.1913 | 0.1913 | 0.1913 | 0.1913 |
| S-15 | P-15 | $Al_2O_3$ | $Al_2O_3$ | $Al_2O_3$ | $Al_2O_3$ | 0.1913 | 0.1913 | 0.1913 | 0.1913 |
| * S-16 | P-16 | — | — | — | — | — | — | — | — |
| S-17 | P-17 | $TiO_2$ | $TiO_2$ | $TiO_2$ | $TiO_2$ | 0.1250 | 0.1250 | 0.1250 | 0.1250 |
| S-18 | P-18 | $Al_2O_3$ | $Al_2O_3$ | $Al_2O_3$ | $Al_2O_3$ | 0.1250 | 0.1250 | 0.1250 | 0.1250 |

* Out of the range of the present invention

A method for identifying the type of oxide included in the via-conductors 2 is described below. The ceramic wiring board 100 was ground with a mechanical grinder to a plane containing the diameters of the via-conductors 2 in order to The interaction between the ceramic insulator 1 and the via-conductors 2 was analyzed on the basis of the results of the analysis of the ceramic insulator 1 and the via-conductors 2. Table 9 summarizes the results.

TABLE 9

| Test | Conductive paste | Common | Difference in basicity | | | |
|---|---|---|---|---|---|---|
| specimen No. | Composition No. | element | φ30 μm | φ50 μm | φ100 μm | φ150 μm |
| S-1 | P-1 | Ti | 0.018 | 0.018 | 0.018 | 0.018 |
| S-2 | P-2 | Ti | 0.018 | 0.018 | 0.018 | 0.018 |
| S-3 | P-3 | Ti | 0.018 | 0.018 | 0.018 | 0.018 |
| S-4 | P-4 | Ti | 0.018 | 0.018 | 0.018 | 0.018 |
| S-5 | P-5 | Ti | 0.018 | 0.018 | 0.018 | 0.018 |
| S-6 | P-6 | Ti | 0.018 | 0.018 | 0.018 | 0.018 |
| S-7 | P-7 | Ti | 0.018 | 0.018 | 0.018 | 0.018 |
| * S-8 | P-8 | Si | 0.143 | 0.143 | 0.143 | 0.143 |
| * S-9 | P-9 | Si | 0.143 | 0.143 | 0.143 | 0.143 |
| * S-10 | P-10 | None | 0.642 | 0.642 | 0.642 | 0.642 |
| * S-11 | P-11 | None | 0.642 | 0.642 | 0.642 | 0.642 |
| * S-12 | P-12 | None | 0.040 | 0.040 | 0.040 | 0.040 |
| * S-13 | P-13 | None | 0.040 | 0.040 | 0.040 | 0.040 |
| S-14 | P-14 | Al | 0.049 | 0.049 | 0.049 | 0.049 |

TABLE 9-continued

| Test specimen No. | Conductive paste Composition No. | Common element | Difference in basicity | | | |
|---|---|---|---|---|---|---|
| | | | φ30 μm | φ50 μm | φ100 μm | φ150 μm |
| S-15 | P-15 | Al | 0.049 | 0.049 | 0.049 | 0.049 |
| * S-16 | P-16 | None | — | — | — | — |
| S-17 | P-17 | Ti | 0.018 | 0.018 | 0.018 | 0.018 |
| S-18 | P-18 | Al | 0.018 | 0.018 | 0.018 | 0.018 |

* Out of the range of the present invention

The metal element included in the amorphous constituent of the ceramic insulator 1 and the oxide included in the via-conductors 2 in common is shown in the column "Common element" in Table 9. The absolute value of the difference in the degree of basicity between the amorphous constituent of the ceramic insulator 1 and the oxide included in the via-conductors 2 is shown in the column "Difference in basicity" in Table 9.

The concentration of the common element in the tubular regions 3 of the ceramic insulator 1 which adjoin to the respective via-conductors 2 so as to surround the via-conductors 2 and the concentration of the common element in the regions 4 other than the tubular regions were analyzed. The crystalline constituent containing the common element which was present in the tubular regions 3 was identified. Table 10 summarizes the results.

STEM/EDAX in order to determine the concentrations of the common element in the thin pieces.

The concentration of the common element in the tubular region 3 and the concentration of the common element in the region 4 other than the tubular region were compared with each other. When the concentration of the common element in the tubular region 3 was higher, "High" is shown in the column "Common element" in Table 10. When the concentration of the common element in the tubular region 3 was equal to or lower than the concentration of the common element in the region 4 other than the tubular region, "Low" is shown in the column "Common element" in Table 10.

A method for identifying the crystalline constituent containing the common element which is present in the tubular region 3 is described below. A thin piece was cut, by the same process as described above, from the tubular region 3

TABLE 10

| | | Tubular region | | | | | | | |
|---|---|---|---|---|---|---|---|---|---|
| | | φ30 μm | | φ50 μm | | φ100 μm | | φ150 μm | |
| Test specimen No. | Conductive paste Composition No. | Common element | Crystalline oxide | Common element | Crystalline oxide | Common element | Crystalline oxide | Common element | Crystalline oxide |
| S-1 | P-1 | High | $Ba_2TiSi_2O_8$ | High | $Ba_2TiSi_2O_8$ | High | $Ba_2TiSi_2O_8$ | High | $Ba_2TiSi_2O_8$ |
| S-2 | P-2 | High | $Ba_2TiSi_2O_8$ | High | $Ba_2TiSi_2O_8$ | High | $Ba_2TiSi_2O_8$ | High | $Ba_2TiSi_2O_8$ |
| S-3 | P-3 | High | $Ba_2TiSi_2O_8$ | High | $Ba_2TiSi_2O_8$ | High | $Ba_2TiSi_2O_8$ | High | $Ba_2TiSi_2O_8$ |
| S-4 | P-4 | High | $Ba_2TiSi_2O_8$ | High | $Ba_2TiSi_2O_8$ | High | $Ba_2TiSi_2O_8$ | High | $Ba_2TiSi_2O_8$ |
| S-5 | P-5 | High | $Ba_2TiSi_2O_8$ | High | $Ba_2TiSi_2O_8$ | High | $Ba_2TiSi_2O_8$ | High | $Ba_2TiSi_2O_8$ |
| S-6 | P-6 | High | $Ba_2TiSi_2O_8$ | High | $Ba_2TiSi_2O_8$ | High | $Ba_2TiSi_2O_8$ | High | $Ba_2TiSi_2O_8$ |
| S-7 | P-7 | High | $Ba_2TiSi_2O_8$ | High | $Ba_2TiSi_2O_8$ | High | $Ba_2TiSi_2O_8$ | High | $Ba_2TiSi_2O_8$ |
| * S-8 | P-8 | Low | — | Low | — | Low | — | Low | — |
| * S-9 | P-9 | Low | — | Low | — | Low | — | Low | — |
| * S-10 | P-10 | Low | — | Low | — | Low | — | Low | — |
| * S-11 | P-11 | Low | — | Low | — | Low | — | Low | — |
| * S-12 | P-12 | Low | — | Low | — | Low | — | Low | — |
| * S-13 | P-13 | Low | — | Low | — | Low | — | Low | — |
| S-14 | P-14 | High | $BaAl_2Si_2O_8$ | High | $BaAl_2Si_2O_8$ | High | $BaAl_2Si_2O_8$ | High | $BaAl_2Si_2O_8$ |
| S-15 | P-15 | High | $BaAl_2Si_2O_8$ | High | $BaAl_2Si_2O_8$ | High | $BaAl_2Si_2O_8$ | High | $BaAl_2Si_2O_8$ |
| * S-16 | P-16 | Low | $Ba_2TiSi_2O_8$ | Low | $Ba_2TiSi_2O_8$ | Low | $Ba_2TiSi_2O_8$ | Low | $Ba_2TiSi_2O_8$ |
| S-17 | P-17 | High | $Ba_2TiSi_2O_8$ | High | $Ba_2TiSi_2O_8$ | High | $Ba_2TiSi_2O_8$ | High | $Ba_2TiSi_2O_8$ |
| S-18 | P-18 | High | $BaAl_2Si_2O_8$ | High | $BaAl_2Si_2O_8$ | High | $BaAl_2Si_2O_8$ | High | $BaAl_2Si_2O_8$ |

* Out of the range of the present invention

A method for analyzing the concentration of the common element in the tubular regions 3 and the concentration of the common element in the regions 4 other than the tubular regions is described below. A thin piece was cut, by FIB processing, from a region (i.e., the tubular region 3) that extended 5 μm from the interface 2a between the ceramic insulator 1 and the via-conductor 2, which is defined as described above, and from a region (i.e., the region 4 other than the tubular region) that extended 5 μm from a position 100 μm from the interface 2a. The principal planes of the thin pieces were parallel to the direction orthogonal to the cross section illustrated in FIG. 1. The thin pieces were subjected to an EDX analysis with the above-described that was confirmed to have a higher concentration of the common element by the results of the analysis described above. The thin piece was analyzed by the same method as in the identification of the types of the crystalline constituents of the ceramic insulator 1 in order to identify the types of the oxides interspaced in the above region. The results of the above analysis are shown in the column "Type" of "Crystalline oxide" included in "Tubular region" in Table 10.

The plating-film formability of the end portions of the via-conductors 2 which were exposed at the principal plane of the ceramic wiring board 100, the detachment of the via-conductors 2 from the ceramic insulator 1, and the denseness of the via-conductors 2 were evaluated. Table 11 summarizes the results.

and the via-conductors 2. The number of the measurement samples taken from each of the via-conductors 2a to 2d having the above-described diameters was 10.

TABLE 11

| Test specimen | Conductive paste | Evaluation result | | | | | | |
|---|---|---|---|---|---|---|---|---|
| | | Plating-film formability | | | | | | Overall |
| No. | Composition No. | φ30 μm | φ50 μm | φ100 μm | φ150 μm | Detachment | Denseness | evaluation |
| S-1 | P-1 | A | A | A | S | A | S | A |
| S-2 | P-2 | S | S | S | S | A | S | S |
| S-3 | P-3 | S | S | S | S | A | S | S |
| S-4 | P-4 | A | A | A | A | A | A | A |
| S-5 | P-5 | S | S | S | S | A | S | S |
| S-6 | P-6 | S | S | S | S | A | S | S |
| S-7 | P-7 | S | S | S | S | A | S | S |
| * S-8 | P-8 | B | B | B | A | A | S | B |
| * S-9 | P-9 | B | B | B | B | A | A | B |
| * S-10 | P-10 | B | B | B | A | A | S | B |
| * S-11 | P-11 | B | B | B | B | A | A | B |
| * S-12 | P-12 | B | B | B | A | A | S | B |
| * S-13 | P-13 | B | B | B | B | A | A | B |
| S-14 | P-14 | A | A | A | A | A | S | A |
| S-15 | P-15 | A | A | A | A | A | A | A |
| * S-16 | P-16 | S | S | S | S | B | S | B |
| S-17 | P-17 | S | S | S | S | A | S | S |
| S-18 | P-18 | A | A | A | A | A | S | A |

* Out of the range of the present invention

A method for evaluating plating-film formability of the end portions of the via-conductors 2 which are exposed at the principal plane of the ceramic wiring board 100 is described below. The exposed end portions of the via-conductors 2 were subjected to an electroless Ni-plating treatment. Subsequent to the plating treatment, the thicknesses of the Ni films deposited on the end portions of the via-conductors 2 were measured using fluorescent X-rays. The number of the measurement samples taken from each of the via-conductors 2a to 2d having the above-described diameters was 100.

The average thickness of the Ni films deposited on each of the via-conductors 2a to 2d was calculated. A specimen in which the Ni film had a thickness of more than 4 μm was considered to have particularly high Ni-plating-film formability and marked as "S" in the column "Plating-film formability" in the evaluation results shown in Table 11. A specimen in which the Ni film had a thickness of 1 μm or more and 4 μm or less was considered to have high Ni-plating-film formability and marked as "A" in the above column of Table 11. A specimen in which the Ni film had a thickness of less than 1 μm was considered to have low Ni-plating-film formability and marked as "B" in the above column of Table 11.

A method for evaluating the detachment between the ceramic insulator 1 and the via-conductors 2 is described below. The ceramic wiring board 100 was impregnated with a fluorescent liquid. Subsequent to the fluorescent-liquid impregnation treatment, the resulting ceramic wiring board 100 was dried at 150° C. for 10 minutes with a hot-air dryer. The ceramic wiring board 100 was subsequently ground to a plane containing the diameters of the via-conductors 2 with a mechanical grinder such that a cross section of the ceramic wiring board 100 was exposed. The cross section of the ceramic wiring board 100 was inspected with a fluorescence microscope in order to determine whether the fluorescent liquid was present between the ceramic insulator 1 and the via-conductors 2. The number of the measurement samples taken from each of the via-conductors 2a to 2d included in a specimen, it was considered that the detachment between the ceramic insulator 1 and the via-conductors 2 was absent in the specimen and the specimen was marked as "A" in the column "Detachment" in the evaluation results shown in Table 11. When the presence of the fluorescent liquid between the ceramic insulator 1 and the via-conductors 2 was confirmed in even one of the ten samples taken from each of the via-conductors 2a to 2d included in a specimen, it was considered that the detachment between the ceramic insulator 1 and the via-conductors 2 was present in the specimen and the specimen was marked as "B" in the above column of Table 11.

A method for evaluating the denseness of the via-conductors 2 is described below. A cross section of the ceramic wiring board 100 was exposed by the same method as described above and inspected with a fluorescence microscope in order to measure the depth of the impregnation of the via-conductors 2 with the fluorescent liquid. The number of the measurement samples taken from each of the via-conductors 2a to 2d having the above-described diameters was 10.

The average depth of the impregnation of the via-conductors 2a to 2d with the fluorescent liquid was determined. A specimen having a fluorescent-liquid impregnation depth of less than 20 μm was considered to have particularly high denseness and marked as "S" in the column "Denseness" of the evaluation results in Table 11. A specimen having a fluorescent-liquid impregnation depth of 20 μm or more and 40 μm or less was considered to have high denseness and marked as "A" in the above column of Table 11. A specimen having a fluorescent-liquid impregnation depth of more than 40 μm was considered to have poor denseness and marked as "B" in the above column of Table 11.

A specimen evaluated as "B" in terms of even one of the above three items, that is, plating-film formability, detachment, and denseness, was considered to be out of the scope of the present invention and marked as "B" in the column "Overall evaluation" in the evaluation results shown in Table 11. A specimen that was not evaluated as "B" in terms of any of the three items and was evaluated as "S" in terms of plating-film formability of the via-conductor 2a (having a diameter of 30 μm) was considered to be particularly good and marked as "S" in the above column of Table 11. A specimen that was not evaluated as "B" in terms of any of the three items and was evaluated as "A" in terms of plating-film formability of the via-conductor 2a was considered to be good and marked as "A" in the above column of Table 11.

As is clear from the results shown in Table 11, the ceramic wiring boards 100 of Test Specimen Nos. S-1 to S-7, S-14, S-15, S-17, and S-18 that fall within the scope of the present invention were excellent in terms of plating-film formability, detachment, and denseness.

As described above, the ceramic insulator 1 included in the ceramic wiring board 100 includes ions of the common metal described above which have diffused into the amorphous constituent of the ceramic insulator 1 when the unfired ceramic wiring board 10 is fired. Since the solid solubility limit of the common element is low, the ions of the common element react with the amorphous constituent and a crystalline constituent precipitates from the amorphous constituent. As a result, the content of the amorphous constituent in the ceramic insulator 1 is reduced. In addition, when the ions of the common element react with the amorphous constituent to form a crystalline constituent, a metal element (e.g., an alkaline-earth metal element) included in the amorphous constituent which reduces the viscosity of the amorphous constituent molten at high temperatures migrates into the crystalline constituent. Thus, the residual amorphous constituent has high viscosity at high temperatures.

For the above-described effects, the amount of amorphous constituent that migrates from the unfired ceramic insulator 8 into the unfired via-conductors 9 when the unfired ceramic wiring board 10 is fired is considered to be reduced and the likelihood of the amorphous constituent rising to the end portions of the via-conductors 2 is considered to be limited.

The amount of $TiO_2$, which reduces the difference in the degree of basicity compared with $Al_2O_3$, soluble in the amorphous constituent of the ceramic insulator 1 is smaller than the amount of $Al_2O_3$ soluble in the amorphous constituent of the ceramic insulator 1. Moreover, $TiO_2$ forms a crystalline constituent (fresnoite) upon being dissolved in the amorphous constituent of the ceramic insulator 1. As a result, the viscosity of the amorphous constituent of the ceramic insulator 1 is increased in the tubular regions 3 that adjoin to the respective via-conductors 2 so as to surround the via-conductors 2. This inhibits the migration of the amorphous constituent into the via-conductors 2.

—Modification Example of Method for Producing Ceramic Wiring Board—

Figure 7:
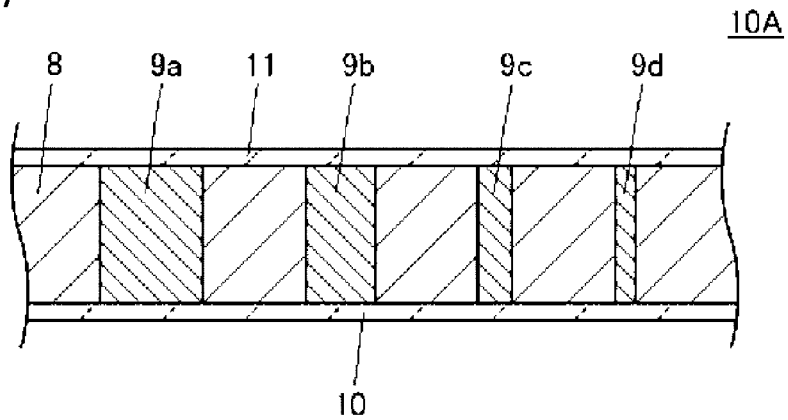
FIG. 7 is a diagram schematically illustrating an unfired ceramic wiring board 10A prepared in a fifth step further including a substep of stacking shrinkage-reduction green sheets, the unfired ceramic wiring board 10A being interposed between shrinkage-reduction green sheets 11.

A modification example of the method for producing the ceramic wiring board 100 according to the embodiment of the present invention is described below with reference to FIG. 7. FIG. 7 is a diagram schematically illustrating an unfired ceramic wiring board 10A interposed between shrinkage-reduction green sheets 11 which is produced in the case where the fifth step (i.e., the green sheet-stacking step) described above further includes a shrinkage-reduction green sheet-stacking substep.

In the above modification example, the first to fourth and sixth steps are the same as in the method for producing the ceramic wiring board 100 described above. The fifth step further including the shrinkage-reduction green sheet-stacking substep is described below while the detailed descriptions of the other steps are outlined.

Shrinkage-reduction green sheets 11 including an $Al_2O_3$ powder as a raw-material powder of a shrinkage-reduction material were prepared by the same method as in the first step (i.e., the green sheet-preparing step) of the method for producing the ceramic wiring board 100. Green sheets 5 having via-holes 6a to 6d filled with a conductive paste 7 of Conductive-Paste Composition No. P-2 were prepared by the first step to the fourth step (i.e., the conductive paste-charging step).

In the fifth step, the shrinkage-reduction green sheets 11 and the green sheets 5 were stacked in a predetermined number on top of one another and thermocompression-bonded to one another to form an unfired ceramic wiring board 10A. In this step, the shrinkage-reduction green sheets 11 and the green sheets 5 were arranged such that the unfired ceramic wiring board 10A was interposed between the shrinkage-reduction green sheets 11. The number of the shrinkage-reduction green sheets 11 included in the multilayer body is not limited but needs to be determined such that the shrinkage of the ceramic wiring board in the principal-plane direction which occurs when the ceramic wiring board is fired is reduced.

In the sixth step (i.e., the firing step), the unfired ceramic wiring board 10A was fired to form a ceramic wiring board 100 interposed between the shrinkage-reduction layers. In this embodiment, the fired ceramic wiring board 100 was subjected to a sandblasting treatment in order to remove the shrinkage-reduction layers sandwiching the ceramic wiring board 100. The ceramic wiring board 100 prepared as described above is referred to as Test Specimen No. S-19. A ceramic wiring board 100 (Test Specimen No. S-2) prepared using green sheets 5 filled with the same conductive paste 7 as described above but without the shrinkage-reduction green sheets 11 was used for comparison.

The ceramic wiring board 100 of Test Specimen No. S-19 was evaluated as in the above-described embodiment of the present invention. The amounts of the end portions of the via-conductors 2a to 2d which protruded at the principal plane of each of the ceramic wiring boards 100 of Test Specimen Nos. S-2 and S-19 were measured. For measuring the amount of protrusion, a laser displacement microscope was used. The number of measurement samples taken from each of the via-conductors 2a to 2d was 100. The average of the results of the measurement of the 100 samples taken from each of the via-conductors 2a to 2d was considered to be the amount of protrusion of the via-conductor. Table 12 summarizes the results.

TABLE 12

| Test specimen No. | Conductive paste Composition No. | Amount of protrusion (μm) | | | |
| --- | --- | --- | --- | --- | --- |
| | | φ30 μm | φ50 μm | φ100 μm | φ150 μm |
| S-2 | P-2 | 5 | 8 | 14 | 20 |
| S-19 | P-18 | 2 | 4 | 8 | 12 |

As is clear from the results shown in Table 12, the amounts of protrusions of the via-conductors 2a to 2d included in the ceramic wiring board 100 of Test Specimen No. S-19 were smaller than those of Test Specimen No. S-2. The results of the evaluations of the ceramic wiring board 100 of Test Specimen No. S-19 which were made in terms of items other than the amount of protrusion were the same as the results of the evaluations of the ceramic wiring board 100 of Test Specimen No. S-2.

—Modification Example of Ceramic Wiring Board—

Figure 8:
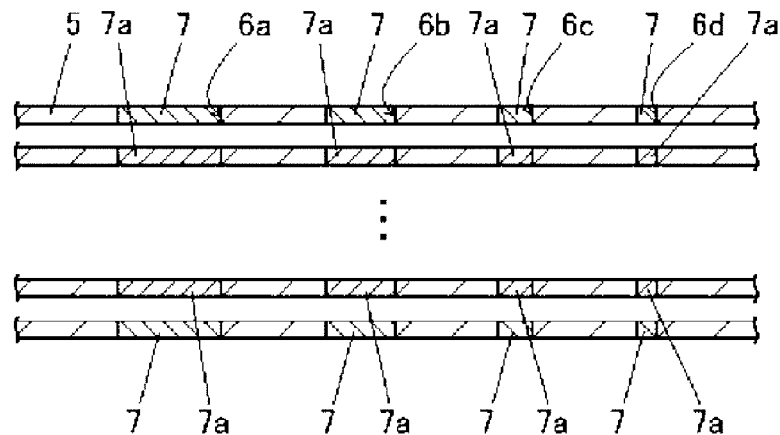
FIG. 8 is a diagram used for explaining a method for producing a ceramic wiring board 100A that is a modification example of a ceramic wiring board according to an embodiment of the present invention, schematically illustrating a green sheet 5 prepared in a fourth step.
Figure 9:
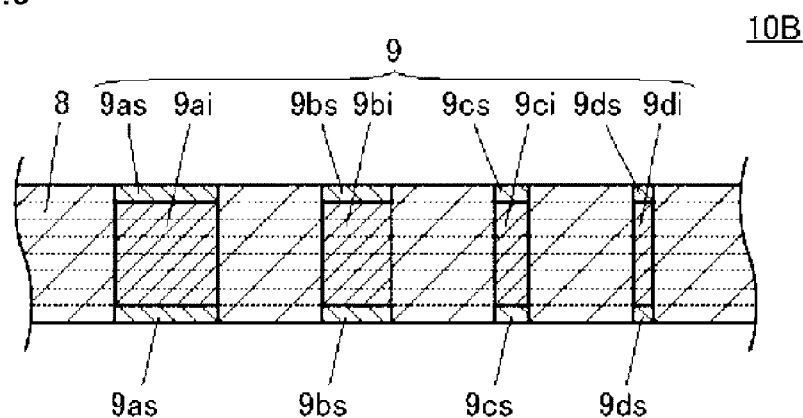
FIG. 9 is diagram used for the same purpose as in FIG. 8, schematically illustrating an unfired ceramic wiring board 10B prepared in a fifth step.
Figure 10:
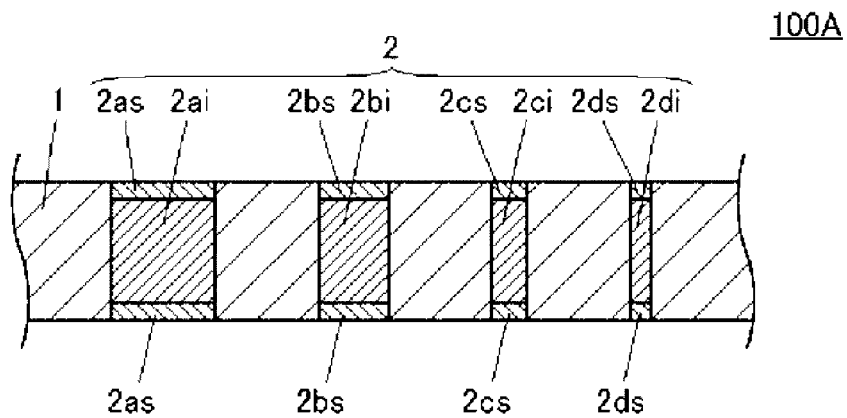
FIG. 10 is diagram used for the same purpose as in FIG. 8, schematically illustrating a ceramic wiring board 100A prepared in a sixth step.

A modification example of the ceramic wiring board according to the above-described embodiment of the present invention, that is, a ceramic wiring board 100A, is described below with reference to FIGS. 8 to 10. FIG. 8 is a diagram schematically illustrating green sheets 5 prepared in the fourth step described above. FIG. 9 is a diagram schematically illustrating an unfired ceramic wiring board 10B prepared in the fifth step described above. FIG. 10 is a diagram schematically illustrating a ceramic wiring board 100A prepared in the sixth step described above.

In the above modification example, the first to third, fifth, and sixth steps are the same as in the method for producing the ceramic wiring board 100 described above. Thus, a fourth step in which a conductive paste 7a different from the conductive paste 7 is used in combination with the conductive paste 7 is described below while the detailed descriptions of the other steps are outlined.

While, in the above-described embodiment, the via-holes 6a to 6d formed in each of a plurality of green sheets 5 are filled with the same conductive paste 7 in the fourth step illustrated in FIG. 4, in this modification example, the via-holes 6a to 6d formed in the bottom and top green sheets 5 in FIG. 4 are filled with the conductive paste 7 and the via-holes 6a to 6d formed in the other green sheets 5 are filled with the conductive paste 7a different from the conductive paste 7 as illustrated in FIG. 8. The green sheets 5 having the via-holes 6a to 6d filled with the conductive paste 7 may be a plurality of layers including the top layer and a plurality of layers including the bottom layer.

FIG. 9 illustrates an unfired ceramic wiring board 10B prepared in the fifth step by thermocompression-bonding the green sheets 5 prepared in the fourth step to one another. The unfired via-conductors 9a to 9d included in the unfired ceramic wiring board 10B include portions 9as to 9ds composed of the conductive paste 7, which are located in the vicinities of the respective principal planes of the unfired ceramic wiring board 10B and at which end portions of the respective unfired via-conductors 9a to 9d are exposed; and portions 9ai to 9di composed of the conductive paste 7a, which are located inside the unfired ceramic wiring board 10B.

FIG. 10 illustrates a ceramic wiring board 100A prepared in the sixth step by firing the unfired ceramic wiring board 10B. The via-conductors 2a to 2d included in the ceramic wiring board 100A include portions 2as to 2ds, respectively, formed by sintering the conductive paste 7 as described above, which are located in the vicinities of the respective principal planes of the ceramic wiring board 100A and at which end portions of the respective via-conductors are exposed; and portions 2ai to 2di, respectively, formed of the sintered conductive paste 7a, which are located inside the ceramic wiring board 100A.

In this modification example, the via paste used for forming vias disposed in the ceramic wiring board 100A does not include the metal element included also in the crystalline constituents of the ceramic insulator 1 in common. That is, portions of the ceramic wiring board 100A which adjoin to the via-conductors 2 so as to surround the via-conductors 2 and have a high concentration of the metal element are the portions 2as to 2ds located in the vicinities of the respective principal planes of the ceramic wiring board 100A. It is considered that, in such a case, the tubular regions 3 of the ceramic insulator 1 which adjoin to the respective via-conductors 2 so as to surround the via-conductors 2 and have a thickness of 5 μm have a high concentration of the metal element than the regions 4 other than the tubular regions.

Accordingly, also in this modification example, the amount of amorphous constituent that migrates from the unfired ceramic insulator 8 into the unfired via-conductor 9 when the unfired ceramic wiring board 10B is fired can be reduced and the likelihood of the amorphous constituent rising to the end portions of the via-conductors 2 can be limited. As a result, the likelihood of the via-conductors 2 detaching from the ceramic insulator 1 can be reduced.

The present invention is not limited to the above-described embodiments. Various modifications and variations may be made within the scope of the present invention. It should be noted that the actions described herein are only estimation and the present invention is not established on the basis of the actions only. It should also be noted that the embodiments described herein are exemplary and partial replacement of components and the merge of components between different embodiments may be possible.

REFERENCE SIGNS LIST

100 CERAMIC WIRING BOARD
1 CERAMIC INSULATOR
2 VIA-CONDUCTOR
3 TUBULAR REGION
4 REGION OTHER THAN TUBULAR REGION

The invention claimed is:
1. A ceramic wiring board comprising:
a ceramic insulator including a crystalline constituent and an amorphous constituent;
a via-conductor formed in the ceramic insulator, the via-conductor including a metal and an oxide the crystalline constituent and the oxide including a metal element in common; and
a tubular region adjoining and surrounding the via-conductor, the tubular region having a concentration of the metal element higher than that of the ceramic insulator,
wherein an absolute value of a difference in a degree of basicity between the amorphous constituent and the oxide is 0.049 or less, a degree of basicity BMi-O of the oxide is represented by (1) and (2) as follows:

$$B_{Mi-O} = \frac{B_{Mi-O_0} - B_{Si-O_0}}{B_{Ca-O_0} - B_{Si-O_0}} \quad (1)$$

when the oxide includes a plurality of cationic constituents, $$B = \sum_i n_i B_{Mi-O}$$

where $n_i$ represents a compositional proportion of a cation $M_i$, $$B_{Mi-O_0} = \frac{(r_{Mi} + 1.4)^2}{2Z_{Mi}} \quad (2)$$

where $BMi\text{-}O_0$ is the oxygen-donating ability of MiO,
MiO represents an oxide of an element,
$BSi\text{-}O_0$ is oxygen-donating ability of $SiO_2$,
$BCa\text{-}O_0$ is oxygen-donating ability of CaO,
rMi is a Pauling's ionic radius (Å) of the cation Mi,
ZMi is a valence of the cation Mi, and the calculated BMi-O being rounded to four decimal places.

2. The ceramic wiring board according to claim 1, wherein the tubular region has a thickness of 5 μm.

3. The ceramic wiring board according to claim 1, wherein the tubular region includes a crystalline constituent including the metal element.

4. The ceramic wiring board according to claim 3, wherein the metal element is Ti.

5. The ceramic wiring board according to claim 4, wherein the crystalline constituent including the metal element includes a fresnoite compound including Ba, Ti, and Si.

6. The ceramic wiring board according to claim 3, wherein the metal element is Al.

7. The ceramic wiring board according to claim 6, wherein the crystalline constituent including the metal element includes a celsian compound including Ba, Al, and Si.

8. The ceramic wiring board according to claim 1, wherein the via-conductor has a diameter of 100 μm or less.

9. The ceramic wiring board according to claim 1, wherein the via-conductor is exposed at a surface of the ceramic wiring board.

10. A method for producing a ceramic wiring board, the method comprising:
   preparing ceramic green sheets including a raw-material powder;
   forming a via-hole in at least one of the green sheets so as to penetrate the green sheet;
   preparing a conductive paste, the conductive paste including a metal powder, an additive, and an organic vehicle, the additive including a metal element that is also included in the raw-material powder of the ceramic green sheets;
   filling the via-hole with the conductive paste;
   stacking the green sheets including the green sheet having the via-hole filled with the conductive paste on top of one another to form an unfired ceramic wiring board having an unfired ceramic insulator and an unfired via-conductor; and
   firing the unfired ceramic wiring board to (1) sinter the unfired ceramic insulator into a ceramic insulator including a crystalline constituent including the metal element and an amorphous constituent, (2) sinter the unfired via-conductor into a via-conductor including a metal and an oxide, and (3) diffuse the metal element in the amorphous constituent to create a tubular region adjoining and surrounding the via-conductor, the tubular region having a concentration of the metal element higher than that of the ceramic insulator,
   wherein the additive is at least one selected from a $TiO_2$ powder and an $Al_2O_3$ powder, and
   wherein the $TiO_2$ powder and the $Al_2O_3$ powder have a specific surface area of 10 m²/g or more.

11. The method for producing the ceramic wiring board according to claim 10, wherein the tubular region has a thickness of 5μm.

12. The method for producing the ceramic wiring board according to claim 10, wherein the via-conductor has a diameter of 100 μm or less.

13. The method for producing the ceramic wiring board according to claim 10, wherein the raw-material powder includes a compound containing $SiO_2$, and at least one selected from $TiO_2$ and $Al_2O_3$, and Ba.

14. A method for producing a ceramic wiring board, the method comprising:
   preparing ceramic green sheets including a raw-material powder;
   forming a via-hole in at least one of the green sheets so as to penetrate the green sheet;
   preparing a conductive paste, the conductive paste including a metal powder, an additive, and an organic vehicle, the additive including a metal element that is also included in the raw-material powder of the ceramic green sheets;
   filling the via-hole with the conductive paste;
   stacking the green sheets including the green sheet having the via-hole filled with the conductive paste on top of one another to form an unfired ceramic wiring board having an unfired ceramic insulator and an unfired via-conductor; and
   firing the unfired ceramic wiring board to (1) sinter the unfired ceramic insulator into a ceramic insulator including a crystalline constituent including the metal element and an amorphous constituent, (2) sinter the unfired via-conductor into a via-conductor including a metal and an oxide, and (3) diffuse the metal element in the amorphous constituent to create a tubular region adjoining and surrounding the via-conductor, the tubular region having a concentration of the metal element higher than that of the ceramic insulator,
   wherein the firing of the unfired ceramic wiring board includes a first substep of holding at a first temperature of $T_1$ °C. to $T_1+50$° C. for 1 hour or more, and a second substep of holding at a second temperature greater than $T_1+50$° C. for 1 hour or more, where $T_1$ is a sintering-starting temperature of the unfired ceramic insulator.

15. The method for producing the ceramic wiring board according to claim 14, wherein the additive is at least one selected from a $TiO_2$ powder and an $Al_2O_3$ powder.

16. The method for producing the ceramic wiring board according to claim 14, wherein the additive is at least one selected from a Ti-containing organic compound and an Al-containing organic compound.

17. The method for producing the ceramic wiring board according to claim 14, further comprising stacking a shrinkage-reduction green sheet on each principal plane of the unfired ceramic wiring board, the shrinkage-reduction green sheet including a shrinkage-reducing material that does not become sintered or shrink at $T_1+50$° C.

* * * * *